United States Patent
Wang et al.

(10) Patent No.: US 10,347,467 B2
(45) Date of Patent: Jul. 9, 2019

(54) EMBEDDED MASK PATTERNING PROCESS FOR FABRICATING MAGNETIC MEDIA AND OTHER STRUCTURES

(71) Applicant: Regents of the University of Minnesota, Minneapolis, MN (US)

(72) Inventors: Jian-Ping Wang, Shoreview, MN (US); Patrick Quarterman, Minneapolis, MN (US); Jianxin Zhu, Eagan, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 15/243,689

(22) Filed: Aug. 22, 2016

(65) Prior Publication Data

US 2017/0054073 A1    Feb. 23, 2017

Related U.S. Application Data

(60) Provisional application No. 62/208,438, filed on Aug. 21, 2015, provisional application No. 62/218,881, (Continued)

(51) Int. Cl.
*H01F 41/30* (2006.01)
*H01J 37/32* (2006.01)
(Continued)

(52) U.S. Cl.
CPC ........ *H01J 37/3244* (2013.01); *H01F 41/308* (2013.01); *H01J 37/3178* (2013.01);
(Continued)

(58) Field of Classification Search
CPC .............. H01L 43/08; H01L 21/32139; H01L 21/31144; H01L 21/76846; H01L 21/32; H01L 29/82
See application file for complete search history.

(56) References Cited

U.S. PATENT DOCUMENTS

| | | |
|---|---|---|
| 4,407,695 A | 10/1983 | Deckman et al. |
| 4,957,591 A | 9/1990 | Sato et al. |

(Continued)

FOREIGN PATENT DOCUMENTS

WO    2014031772 A1    2/2014

OTHER PUBLICATIONS

Notice of Allowance from U.S. Appl. No. 14/422,262, dated Apr. 14, 2017, 14 pp.
(Continued)

*Primary Examiner* — Zandra V Smith
*Assistant Examiner* — John M Parker
(74) *Attorney, Agent, or Firm* — Shumaker & Sieffert, P.A.

(57) ABSTRACT

In some examples, a method including depositing a functional layer over a substrate; depositing a granular layer over the functional layer, the granular layer including a first material defining a plurality of grains separated by a second material defining grain boundaries of the plurality of grains; removing the second material from the granular layer such that the plurality of grains of the granular layer define a hard mask layer on the functional layer; and removing, via reactive ion etching with a carrier gas, portions of the functional layer not masked by the hard mask layer, wherein the carrier gas comprises a gas with an atomic number less than an atomic number of argon.

14 Claims, 15 Drawing Sheets

Related U.S. Application Data filed on Sep. 15, 2015, provisional application No. 62/377,359, filed on Aug. 19, 2016.

(51) Int. Cl.
| | |
|---|---|
| *H01L 29/82* | (2006.01) |
| *H01L 43/08* | (2006.01) |
| *H01J 37/317* | (2006.01) |
| *H01L 21/311* | (2006.01) |
| *H01L 21/3213* | (2006.01) |

(52) U.S. Cl.
CPC ...... *H01J 37/321* (2013.01); *H01L 21/31144* (2013.01); *H01L 21/32139* (2013.01); *H01L 29/82* (2013.01); *H01L 43/08* (2013.01); *H01J 2237/334* (2013.01)

(56) References Cited

U.S. PATENT DOCUMENTS

| | | | |
|---|---|---|---|
| 5,372,962 | A | 12/1994 | Hirota et al. |
| 5,676,853 | A | 10/1997 | Alwan |
| 5,776,853 | A | 7/1998 | Takao |
| 5,966,612 | A | 10/1999 | Wu |
| 6,037,104 | A | 3/2000 | Lahaug |
| 6,051,149 | A | 4/2000 | Frendt |
| 6,068,878 | A | 5/2000 | Alwan |
| 6,174,449 | B1 | 1/2001 | Alwan et al. |
| 6,228,538 | B1 | 5/2001 | Michiels et al. |
| 6,372,404 | B1 | 4/2002 | Wells et al. |
| 6,518,194 | B2 | 2/2003 | Winningham et al. |
| 6,524,874 | B1 | 2/2003 | Alwan |
| 7,018,944 | B1 | 3/2006 | Carnahan |
| 7,158,346 | B2 | 1/2007 | Liu et al. |
| 7,166,538 | B2 | 1/2007 | Doshita |
| 8,586,142 | B2 | 11/2013 | Himmelhaus et al. |
| 9,034,684 | B2 | 5/2015 | Zhang et al. |
| 2002/0012816 | A1* | 1/2002 | Shimizu ............ G11B 5/656 428/831 |
| 2003/0022403 | A1 | 1/2003 | Shimoda |
| 2003/0052080 | A1 | 3/2003 | Baik et al. |
| 2007/0116989 | A1 | 5/2007 | Ikekame et al. |
| 2008/0260941 | A1 | 10/2008 | Jin |
| 2009/0242416 | A1 | 10/2009 | Yun et al. |
| 2009/0250588 | A1 | 10/2009 | Robeson et al. |
| 2010/0167021 | A1* | 7/2010 | Lee ............ H01L 21/31122 428/195.1 |
| 2011/0143169 | A1 | 6/2011 | Albrecht et al. |
| 2012/0015143 | A1 | 1/2012 | Chyan et al. |
| 2012/0140357 | A1 | 6/2012 | Yakushiji et al. |
| 2012/0214001 | A1 | 8/2012 | Little et al. |
| 2013/0180948 | A1* | 7/2013 | Takizawa ............ G11B 5/855 216/22 |
| 2013/0280908 | A1* | 10/2013 | Li ............ H01L 21/30612 438/674 |
| 2014/0104606 | A1 | 4/2014 | Shih |
| 2014/0295208 | A1 | 10/2014 | Fan et al. |
| 2015/0072172 | A1* | 3/2015 | Takizawa ............ G11B 5/855 428/835.6 |

OTHER PUBLICATIONS

Bublat et al., "Influence of dot size and annealing on the magnetic properties of large-area L10-FePt nanopatterns," Journal of Applied Physics, vol. 110, No. 7, 073908, Oct. 11, 2011, 8 pp.

Dong et al., "Well-isolated L10 FePt—SiNx—C nanocomposite films with large coercivity and small grain size," Journal of Applied Physics, vol. 111. No. 7, 07A308, Proceedings of the 56th Annual Conference on Magnetism and Magnetic Materials, Oct. 30-Nov. 3, 2011, 4 pp.

Granz et al., "Granular L10 FePt—B and FePt—B—Ag (001) Thin Films for Heat Assisted Magnetic Recording," Journal of Applied Physics, vol. 111, 07B709, Mar. 8, 2012, 4 pp.

Ho et al., "Quantitative transmission electron microscopy analysis of multi-variant grains in present L10-FePt based heat assisted magnetic recording media," Journal of Applied Physics, vol. 116, 193510, Nov. 20, 2014, 9 pp.

Hu et al., "High-Moment Antiferromagnetic Nanoparticles with Tunable Magnetic Properties," Advanced Materials, vol. 20, No. 8, Apr. 21, 2008, pp. 1479-1483.

Hu et al., "Microstructure Control of L10 Ordered FePt Granular Film for HAMR Application," IEEE Transactions on Magnetics, vol. 49, No. 7, Jul. 2013, pp. 3737-3740.

Hu et al., "High-Moment Antiferromagnetic Nanoparticles with Tunable Magnetic Properties," Advanced Materials, Apr. 4, 2008, 5 pp.

Huda et al., "Fabrication of 5-nm-Sized Nanodots using Self-Assembly of Polystyrene-Poly(dimethylsiloxane)," Japanese Journal of Applied Physics, Special Issue: Microprocesses and Nanotechnology, vol. 51, No. 6, 06FF10, Jun. 20, 2012, 6 pp.

Prosecution History from U.S. Appl. No. 14/422,262 dated Feb. 18, 2015 through Nov. 4, 2016, 46 pp.

Kryder et al., "Heat Assisted Magnetic Recording," Invited Paper, Proceedings of the IEEE, vol. 96, No. 11, Nov. 2008, 26 pp.

Lee et al., "Self-Assembled Plasmonic Nanohole Arrays," Langmuir Articles, American Chemical Society, vol. 25, No. 23, Oct. 15, 2009, pp. 13685-13693.

Zhao et al., "Fabrication of Ultrathin L10-FePt Based Exchange Coupled Composite Media," Journal of Applied Physics, vol. 111, No. 7, 07B732, Proceedings of the 56th Annual Conference on Magnetism and Magnetic Materials, Oct. 30-Nov. 3, 2011, 4 pp.

Ma et al. "Structural and magnetic properties of a core-shell type L10 FePt/Fe exchange coupled nanocomposite with tilted easy axis," Journal of Applied Physics, vol. 109, No. 8, 083907, Apr. 18, 2011, 8 pp.

Ma et al., "L10 FePt/Fe Exchange Coupled Composite Structure on MgO Substrates," IEEE Transactions on Magnetics, vol. 46, No. 6, Jun. 2010, 4 pp.

McCallum et al., "L10 FePt based exchange coupled composite bit patterned films," Applied Physics Letters, vol. 98, No. 24, 242503, Jun. 13, 2011, 4 pp.

Mosendz et al., "Ultra-high coercivity small-grain FePt media for thermally assisted recording (invited)," Journal of Applied Physics, vol. 111, No. 7, 07B729, Proceedings of the 56th Annual Conference on Magnetism and Magnetic Materials, Oct. 30-Nov. 3, 2011, 3 pp.

Park et al., "Prospect of Recording Technologies for Higher Storage Performance," IEEE Transactions on Magnetics, vol. 47, No. 3, Mar. 2011, pp. 539-545.

Rahman et al., "Exploration of the Direct Use of Anodized Alumina as a Mold for Nanoimprint Lithography to Fabricate Magnetic Nanostructure over Large Area," Journal of Nanotechnology, vol. 2011, Article ID 961630, Aug. 24, 2011, 6 pp.

Rea et al., "Writer and Reader Head-to-Media Spacing Sensitivity Assessment in HAMR," TMRC 2015-C1, Digests of the 26th Magnetic Recording Conference, Aug. 17, 2015, 6 pp.

Shafidah et al., "Application of the Grain Flipping Probability Model to Heat Assisted Magnetic Recording," Journal of Applied Physics, vol. 111, Mar. 12, 2012, 4 pp.

Shen et al., "In situ epitaxial growth of ordered FePt (001) films with ultra small and uniform grain size using a RuAl underlayer," Journal of Applied Physics, vol. 97, No. 10, 10H301, May 11, 2005, 4 pp.

Shiroyama et al., "Microstructure and Magnetic Properties of FePt—Cr2O3 Films," IEEE Transactions on Magnetics, vol. 50, No. 11, Nov. 2014, 6 pp.

Terris, "Fabrication challenges for patterned recording media," Journal of Magnetism and Magnetic Materials, vol. 321, Elsevier B.V., Jun. 10, 2008, 8 pp.

Zhu et al., "Effect of Mask Erosion on Patterning of FePt for HAMR Media Using Embedded Mask Patterning," MAGCON-15-11-1953. R1, IEEE Transactions on Magnetics, Jan. 12, 2016, 5 pp.

Zhao et al., "Microstructure Study of Pinning Sites of Highly (0001) Textured Sm(Co,Cu)5 Thin Films Grown on Ru Underlayer," Journal of Applied Physics, vol. 111, No. 7, 07B730, Proceedings of the 56th Annual Conference on Magnetism and Magnetic Materials, Oct. 30-Nov. 3, 2011, 4 pp.

(56) References Cited

OTHER PUBLICATIONS

Varaprasad et al., "Columnar Structure in FePt—C Granular Media for Heat-Assisted Magnetic Recording," IEEE Transactions on Magnetics, vol. 51, No. 11, Nov. 2015, 4 pp.

Victoria et al., Predicted Areal Density Gain for HAMR on Bit Patterned and Granular Media, TMRC 2015-A6, Digests of the 26th Magnetic Recording Conference, Aug. 18, 2015, 6 pp.

Wang et al., "Embedded mask patterning: A nanopatterning process to fabricate FePt magnetic media," Applied Physics Letters, American Institute of Physics, vol. 102, 052406, Feb. 6, 2013, 7 pp.

Wang et al., "Fabrication and Characterization of FePt Exchange Coupled Composite and Graded Bit Patterned Media," IEEE Transactions on Magnetics, vol. 49, No. 2, Feb. 2013, pp. 707-712.

Wang et al., "Novel System Design for Readback at 10 Terabits per Square Inch User Areal Density," IEEE Magnetics Letters, vol. 3, Information Storage, Dec. 20, 2012, 6 pp.

Wang et al., "Characterization of L10-FePt/Fe based exchange coupled composite bit pattern media," Journal of Applied Physics, vol. 111, No. 7, 07B914, Proceedings of the 56th Annual Conference on Magnetism and Magnetic Materials, Oct. 30-Nov. 3, 2011, 4 pp.

Wang et al., "Fabrication of FePt Type Exchange Coupled Composite Bit Patterned Media by Block-copolymer Lithography," Journal of Applied Physics, vol. 109, No. 7, 07B754, Proceedings of the 55th Annual Conference on Magnetism and Magnetic Materials, Nov. 14-18, 2010, 4 pp.

Wang et al., "Spontaneously-formed FePt graded granular media with a large gain factor," IEEE Magnetics Letters, vol. 3, 450014, Apr. 3, 2012, 4 pp.

Weller et al., "A HAMR Media Technology Roadmap to an Areal Density of 4 Tb/in2," IEEE Transactions on Magnetics, vol. 50, No. 1, Jan. 2014, 10 pp.

Weller et al., "High Ku Materials Approach to 100 Gbits/in2," IEEE Transactions on Magnetics, vol. 36, No. 1, Jan. 2000, 6 pp.

Wen et al., "Ultra-Large-Area Self-Assembled Monolayers of Nanoparticles," ACSNANO, vol. 5, No. 11, Oct. 19, 2011, pp. 8868-8876.

Yang et al., "Structure and Magnetic Properties of L10-FePt Thin Films on TiN/RuAl Underlayers," Journal of Applied Physics, vol. 109, Apr. 13, 2011, 4 pp.

Zhang et al., "FePtAg—C Nanogranular Film as Thermally Assisted Magnetic Recording (TAR) Media," IEEE Transactions on Magnetics, vol. 47, No. 10, Oct. 2011, 6 pp.

Zhao et al., "Chemical Stability of Highly (0001) Textured Sm(CoCu)5 Thin Films with a Thin Ta Capping Layer," Journal of Applied Physics, vol. 109, No. 7, 07B715, Proceedings of the 55th Annual Conference on Magnetism and Magnetic Materials, Nov. 14-18, 2010, 4 pp.

Wang et al., "Embedded mask patterning: A nanopatterning process to fabricate FePT magnetic media," Applied Physics Letters 102, American Institute of Physics, Jan. 28, 2013, 5 pp.

Matsunami et al., "Energy Dependence of the Yields of ION-Inducted Sputtering of the Monatomic Solids," IPPJ-AM 32, Institues of Plasma Physics, Nagoya Japan, Sep. 1983, 301 pp.

Xu et al., "In situ ordering of FePt thing films with face-centered-tetragonal (001) texture on Cr100-xRux underlayer at low substrate temperature," Applied Physics Letters, vol. 80, No. 18, May 6, 2002, 3 pp.

Zhao et al., "Fabrication and microstructure of high coercivity FePt thin films at 400° C.," Applied Physics Letters 88, 052503, Feb. 2006, 3 pp.

Wang et al., "Natural Fabrication of FePt based Exchange Coupled Composite Media," 53rd Annual Conference on Magnetism, Magnetic Materials, CC-09, Nov. 10-14, 2008, 18 pp.

Wang et al., "FePt Type Exchange Coupled Composite Media and Multilevel Magnetic Recording," 19th The Magnetic Recording Conference (TMRC), BB-3 (invited), Singapore, Jul. 30, 2008, 40 pp.

Response to Office Action dated Nov. 4, 2016 from U.S. Appl. No. 14/422,262, filed Mar. 6, 2017, 14 pp.

\* cited by examiner

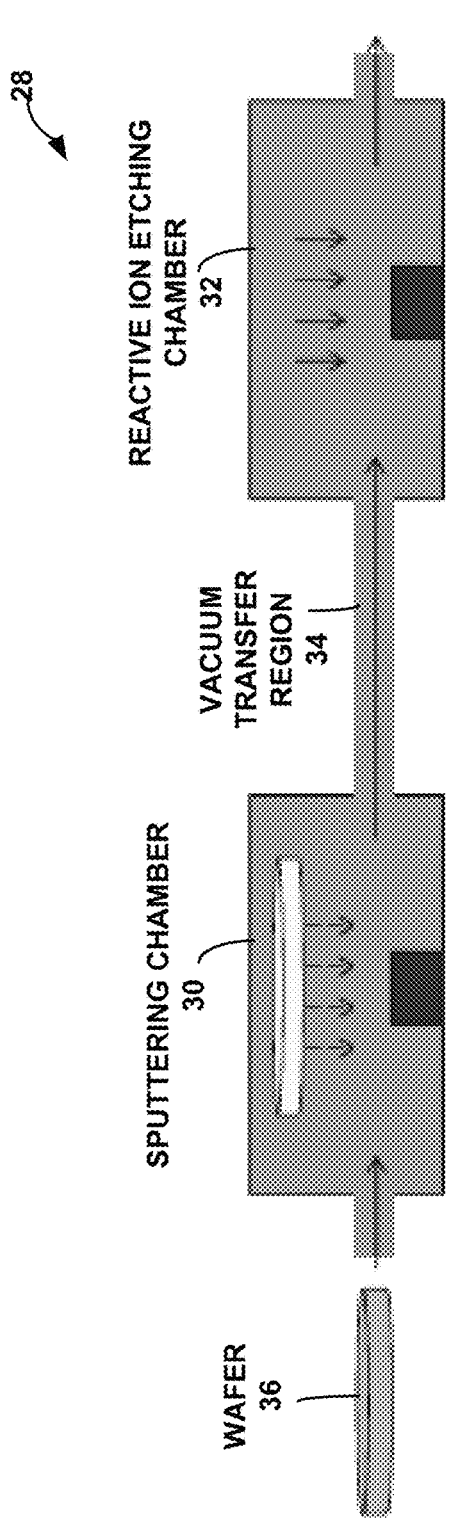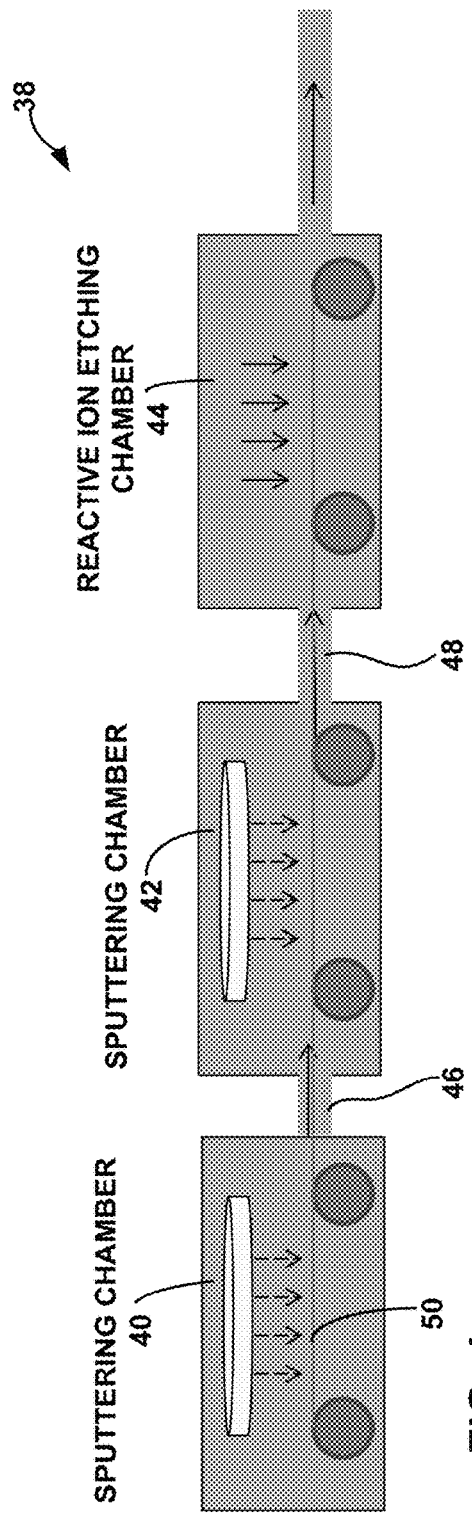

EMBEDDED MASK PATTERNING PROCESS FOR FABRICATING MAGNETIC MEDIA AND OTHER STRUCTURES

This application claims the benefit of U.S. Provisional Patent Application Nos. 62/208,438 (filed Aug. 21, 2015); 62/218,881 (filed Sep. 15, 2015); and 62/377,359 (filed Aug. 19, 2016). The entire content of each of these applications is incorporated herein by reference.

TECHNICAL FIELD

This disclosure relates to fabrication techniques for magnetic recording media and other structures.

BACKGROUND

Many different types of magnetic media have been developed to store information. Examples of such magnetic media include hard drives, magnetic diskettes, magnetic tapes, magnetic tape cartridges, magneto-optical disks. Increasing data storage density is desirable in the development of new or improved types of data storage media. Different multifunctional nanostructures are desirable for a variety of applications, including biomedical sensing, therapy, drug delivery, imaging, protein purification, cell separation, hyperthermia or their combinations. It is also desirable to simplify production and reduce production costs.

SUMMARY

Example systems and techniques applicable to the fabrication of magnetic media, such as magnetic hard drives, are described. Also described are a number of articles and structures fabricated using such techniques. Although this disclosure primarily describes example techniques for use in creating magnetic storage media for hard drives, the disclosure is not limited to such examples. For example, the techniques and structures described herein may be applicable to other types of magnetic storage devices, as well as other types of structures or devices. As described below, the systems and techniques of the disclosure may also be employed for fabrication of artificial nanoparticles, nanohole arrays, and other nanostructures.

Examples of the disclosure may relate to fabrication techniques in which a non-granular magnetic layer may first be deposited on a substrate as substantially continuous thin film. A granular masking layer may then be deposited on the magnetic layer. The masking layer may include two different types of materials, with one material forming the grain and another material forming the grain boundaries. Following the deposition of the granular masking layer, the grain boundary material may be removed (e.g., via an etching process) to leave a mask over portions of the underlying magnetic layer with a desired grain pattern for the underlying layer. Subsequently, the unmasked portions of the magnetic layer may then be removed using a reactive ion etching (RIE) process to transfer the pattern on the grains to the underlying magnetic layer. Following the RIE etching of the magnetic layer, the mask of grains may then be removed, leaving a non-continuous magnetic layer with the desired pattern defined by the mask of grains. In such a manner, the granular masking layer defines the grain size, while the magnetic layer determines the magnetic properties of the recording layer. As such, the grain size of the recording media can be adjusted as desired without changing the recording layer of the media.

The RIE process used to remove the unmasked portion of the magnetic layer may advantageously use one or more elements with an atomic number less than that of argon as a carrier gas, e.g., in combination with methanol. Using such a gas, the RIE process may be able to transfer patterns from the mask onto the magnetic layer, including patterns including features (e.g., grain sizes) of less than about 10 nanometer (nm), with minimal erosion of the mask material during the process. Such patterning may not be achievable using RIE with Ar as the carrier gas because the mask material may be eroded away due to ion milling from the Ar gas during the process prior to removable of enough of the magnetic material to transfer the desired pattern. In some instances, example technique of this disclosure may enable the fabrication of extremely high density magnetic recording media and patterning of, e.g., sub 10 nm features, utilizing RIE for any magnetic based technology, such as magnetic RAM technologies.

In one example, the disclosure relates to a method comprising depositing a functional layer over a substrate; depositing a granular layer over the functional layer, the granular layer including a first material defining a plurality of grains separated by a second material defining grain boundaries of the plurality of grains; removing the second material from the granular layer such that the plurality of grains of the granular layer define a hard mask layer on the functional layer; and removing, via reactive ion etching with a carrier gas, portions of the functional layer not masked by the hard mask layer, wherein the carrier gas comprises a gas with an atomic number less than an atomic number of argon.

In another example, the disclosure relates to a system comprising at least one deposition chamber configured to deposit a functional layer over a substrate, and deposit a granular layer over the functional layer, the granular layer including a first material defining a plurality of grains separated by a second material defining grain boundaries of the plurality of grains; at least one etching chamber configured to remove the second material from the granular layer such that the plurality of grains of the granular layer define a hard mask layer on the functional layer, and remove, via reactive ion etching, portions of the functional layer not masked by the hard mask layer; and at least one gas source configured to supply a carrier gas in the at least one etching chamber during the removal of the portions of the functional layer not masked by the hard mask layer via reactive ion etching, wherein the carrier gas comprises a gas with an atomic number less than an atomic number of argon.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF DRAWINGS

FIGS. 3 and 4 are schematic diagrams illustrating example systems for fabricating an article using an embedded hard mask layer within a vacuum environment.

DETAILED DESCRIPTION

Figure 1:
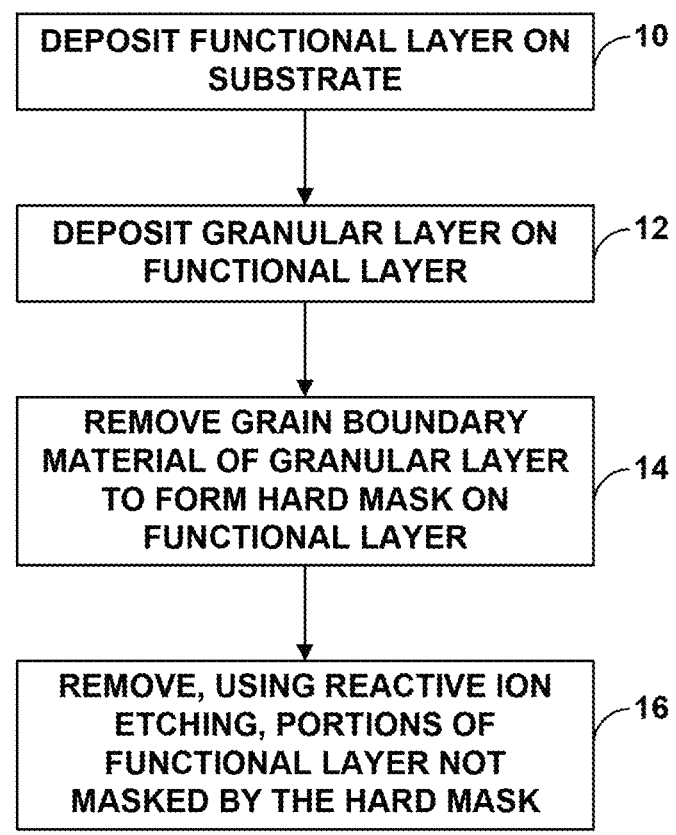
FIG. 1 is a flow diagram illustrating an example technique for fabricating an article using an embedded hard mask layer within a vacuum environment.

Example systems and techniques applicable to the fabrication of magnetic media, such as magnetic hard drives, are described. Also described are a number of articles and structures that may be fabricated using such techniques. Although this disclosure primarily describes example techniques for use in creating magnetic storage media for hard drives, the disclosure is not limited to such examples. For example, the techniques and structures described herein may be applicable to other types of magnetic storage devices, as well as other types of structures or devices. As described below, the systems and techniques of the disclosure may also be employed for fabrication of artificial nanoparticles, nanohole arrays, and other nanostructures. In addition, examples of the disclosure include those details and examples described in PCT Patent Application Publication No. WO2014/031772, filed Aug. 21, 2013, the entire content of which is incorporated by reference herein.

In some example thin film fabrication techniques, magnetic recording media may be fabricated by depositing magnetic materials and non-magnetic materials together to form granular film that may function as a magnetic recording layer. The grains of the granular film may be made of magnetic materials, and the grain boundaries are made of non-magnetic materials. In such cases, however, as the size of the grains in the granular film is reduced, the magnetic properties of the grains may change undesirably. For example, as the size of the grains decrease, magnetic performances of recording media such as Co alloy media will degrade. FePt media may be desirable for use in recording media because of its high anisotropy constant or less degradation of magnetic performance with the reduction of its grain size. However, it is difficult to fabricate FePt media with small grain size while keeping its good magnetic performances by using traditional sputtering process.

In contrast with such techniques in which such granular films are deposited as the magnetic recording layer, examples of the disclosure may include fabrication techniques in which a non-granular magnetic layer may first be deposited on a substrate as substantially continuous thin film. A granular masking layer may then be deposited on the magnetic layer. The masking layer may include two different types of materials, with one material forming the grain and another material forming the grain boundaries, and may be of high selectivity. Following the deposition of the granular masking layer, the grain boundary material may be removed (e.g., via an etching process) to leave a mask over portions of the underlying magnetic layer with a desired grain pattern for the underlying layer. Subsequently, the unmasked portions of the magnetic layer may then be removed using a reactive ion etching (RIE) process to transfer the pattern on the grains to the underlying magnetic layer. Following the RIE etching of the magnetic layer, the mask of grains may then be removed, leaving a non-continuous magnetic layer with the desired pattern defined by the mask of grains. In such a manner, the granular masking layer defines the grain size, while the magnetic layer determines the magnetic properties of the recording layer. As such, the grain size of the recording media can be adjusted as desired without changing the recording layer of the media.

In some examples, the RIE process used to remove unmasked portions of a magnetic layer may utilize an Argon (Ar) carrier gas. However, when such a carrier gas is used for the RIE process to remove the unmasked portions of the continuous magnetic layer, the masking material may also be removed, e.g., due to Ar ion milling away of the mask, before a successful transfer of the pattern defined by the mask to the continuous magnetic layer. Such mask erosion may limit the feature sizes of the patterned magnetic layers formed using such a process, e.g., to features sizes of greater than approximately 20 nanometers (nm). However, for increased areal densities, patterned magnetic layers with features sizes less than approximately 20 nm (e.g., less than approximately 10 nm) may be needed.

In accordance with one or more examples of the disclosure, it has been found that RIE using one or more elements with an atomic number less than that of Ar as a carrier gas to remove the unmasked portions of a continuous magnetic layer reduce or substantially eliminate erosion of the mask material, e.g., as compared to the erosion of the mask material from RIE using other types of carrier gases, such as, e.g., Ar. For ease of illustration, examples of the disclosure are described primarily with RIE using He and/or Ne as carrier gas. However, examples using other elements with an atomic number less than Ar as a carrier gas are envisioned. The reduced erosion of the mask material during the RIE process may allow for removal of the unmasked portions of the magnetic layer to transfer the pattern defined by the mask, e.g., before the mask material is also removed. In some examples, the use of RIE with a He and/or Ne carrier gas may decrease the sputter yield of the mask material during the etching process, and may allow for high aspect ratio patterning of magnetic layers, e.g., with patterned features (e.g., grain size) of less 10 nm, using the techniques described herein. Such a process may be used for magnetoresistive random-access memory (MRAM) and spin torque transfer (STT) application for patterning sub 10 nm features, e.g., since ion milling may cause re-deposition which may short devices on top of the mask corrosion.

In some examples, the deposition of the magnetic layer and granular masking layer, as well as the steps for removing the grain boundary material and, subsequently, unmasked portions of the underlying magnetic layer via such an RIE process, may be carried out in a vacuum environment. For example, such steps may be performed within an environment in which the pressure is less than approximately 500 mTorr, such as, e.g., less than approximately 10 mTorr. In some examples, an apparatus may be used to fabricate a magnetic article such that article remains in a vacuum environment throughout the deposition and etching steps without being removed from the vacuum. For example, an apparatus or system may include one or more deposition chambers (e.g., sputtering chambers) in connection with each other by way of one or more transfer regions configured to allow for the transfer of a substrate (e.g., a wafer) between the chambers while maintaining a vacuum environment. In a similar fashion, a transfer region may connect one or more deposition chamber to one or more material etching chambers. In this manner, the deposition (e.g., sputtering) and etching processes may take place without subjecting the fabricated article to a non-vacuum environment, e.g., between formation of the magnetic and granular layers.

In some examples, exposure to a non-vacuum environment during the deposition and/or removal processes may undesirably result in impurities in one or more the thin film layers. For example, in some cases, a magnetic material may be deposited via sputtering in a vacuum environment to form a magnetic film layer. Once the magnetic layer is formed, the article may then be removed from the sputtering chamber and vacuum environment to form a granular layer on the magnetic layer via a spin coating process. However, the removal of the article from the vacuum environment may lead to impurities on and/or in the granular layer such as air borne particles and water vapors. Some example techniques of the disclosure may address such undesired consequences by forming the magnetic thin film layer and granular layer, as well as removing the grain boundary material and portions of the magnetic thin film layer via an RIE process with He and/or Ne as a carrier gas, all while keeping the article in a vacuum environment during the fabrication process.

FIG. 1 is a flow diagram illustrating an example technique for fabricating an article using an embedded hard mask layer within a vacuum environment. As shown, a functional layer may be deposited on a substrate (10) followed by the deposition of a granular layer on the functional layer (12). The grain boundary material of the granular layer may be removed from the granular layer such that the remaining grains form a hard mask on the functional layer (14). Subsequently, the unmasked portions of the functional layer may be removed via RIE to form a patterned functional layer defined by the hard mask (16).

As described herein, the RIE process may utilize a He, Ne, and/or other element with a lower atomic number than Ar as a carrier gas. By using such a carrier gas, the erosion of the hard mask during the etching process, e.g., due to ion milling of the hard mask and the amount of re-deposition of the sputtered functional material atoms, may be reduced as compared to RIE with Ar as the carrier gas. In some examples, this may allow for suitable transfer of patterns using the example technique of FIG. 1 from a hard mask to a functional layer (e.g., magnetic layer) defining features (e.g., grain sizes) less than approximately 10 nm.

Any suitable RIE system and process parameters may be used to remove the unmasked portion of the magnetic layer while not removing the hard mask prior to transferring the masked pattern to the magnetic layer. Reactive ion etching is an etching technology used in microfabrication. In some examples, RIE is a type of dry etching which has different characteristics than wet etching. RIE may use chemically reactive plasma to remove material deposited on wafers. The plasma may be generated under low pressure (vacuum) by an electromagnetic field. High-energy ions from the plasma may attack the material surface and react with it.

In one example, RIE system includes of a cylindrical vacuum chamber, with a substrate platter situated in the bottom portion of the chamber. The substrate platter is electrically isolated from the rest of the chamber. Gas enters through small inlets in the top of the chamber, and exits to the vacuum pump system through the bottom. Gas pressure may be maintained in a range between a few millitorr (e.g., 1-3 millitorr) and a few hundred millitorr (e.g., 100-300 millitorr) by adjusting gas flow rates and/or adjusting an exhaust orifice. Other types of RIE systems exist, including inductively coupled plasma (ICP) RIE. In this type of system, the plasma may be generated with an RF powered magnetic field. Very high plasma densities may be achieved. In some examples, a combination of parallel plate and inductively coupled plasma RIE is possible. In this system, the ICP is employed as a high density source of ions which increases the etch rate, whereas a separate RF bias is applied to the substrate to create directional electric fields near the substrate or material to achieve more anisotropic etch profiles.

As described herein, the RIE process may use an element with an atomic number less than Ar, such as, e.g., He and/or Ne. In some examples, the gas of the RIE process may also include methanol. In some examples, the gas used for the RIE process may use a gas that consisting of, consisting essentially of, or comprising an element with an atomic number less than Ar, such as, e.g., He and/or Ne. In some examples, the gas may also include methanol. The erosion rate of the hard mask may be minimized by using He and/or Ne (or other element with an atomic number less than Ar), while the methanol provides the etching of the functional layer (e.g., magnetic layer) with low redeposition.

As described herein, example RIE techniques described herein may allow for the successful transfer of patterns from a hard mask to magnetic layer, where those patterns with features (e.g., grain sizes) less than approximately 10 nm, e.g., as a result of the reduced erosion of the hard mask during the RIE. Non-volatile memories that are based on magnetic materials may require minimal mask erosion in order to scale down to such feature sizes, which is not possible with Ar based methanol etching. While methanol based RIE with Ar as the carrier gas may be fundamentally limited by the sputtering away of the hard mask during the process, example techniques of the disclosure may be used to avoid this issue for patterning any nanostructure with RIE.

In some examples, the grain boundary material of the granular layer may be removed from the granular layer such that the remaining grains form a hard mask on the functional layer (14) by etching. In one example, to remove oxide grain boundary material from a metal oxide layer, the etching gas includes $CF_4$ (e.g., at a feed rate of about 50 sccm) and $CHF_3$ (e.g., at a feed rate of about 25 sccm); the working pressure may be about 75 mTorr; power may be about 150 W; and the etching time may be about 2 minutes.

In some examples, the unmasked portions of the functional layer may be removed via REI to form a patterned functional layer defined by the hard mask (16). In one example, the RIE process may use an etching gas of helium and/or Ne (e.g., at a feed rate of about 5 to about 50 sccm) and methanol ($CH_3OH$) (e.g., at a feed rate of about 2 sccm to about 15 sccm); a working pressure of about 50 to about 100 mTorr; a bias voltage of greater than about 350V; and an etching time based on the etch rate of the RIE system. In the RIE process, the erosion rate of the hard mask may be minimized by using He and/or Ne (or other element with an atomic number less than Ar), while the methanol provides the etching of the functional layer (e.g., magnetic layer) with low redeposition. In addition to methanol $CH_3OH$, the examples of alternative gas chemistries used with He include (1) $CO+NH_3$ (Carbon monoxide and Ammonia) and (2) Cl$_2$ (Chlorine). Alternative RIE gas chemistries for etching magnetic materials, e.g., the function layer, include CO+NH$_3$ (+Ar, He, and the like) and Cl$_2$ (+Ar, He, and the like).

The functional layer may be formed of any suitable material desired for the article to function after fabrication. For example, as described herein, such an example technique may be used to fabricate extremely high magnetic recording media (e.g., with FePt, CoPt, FePd, SmCo$_5$, and/or other suitable hard magnetic materials). The technique may allow for a continuous magnetic thin film with desirable magnetic properties to first be formed first on a substrate (either directly or indirectly) as the functional layer, followed by the formation of small grains in the magnetic layer by removing a portion of the continuous magnetic layer in a patterned defined by an overlying hard mask. The overlaying hard mask may be formed by the grains of a granular film layer. In some examples, the functional layer may include multiple layers (such as, e.g., multiple magnetic layers) to form nanoparticles and/or magnetic recording media. In applications in which the techniques described herein form a nanohole array, the functional layer may be formed of Au, Ag, ZrN, Fe4N, Ni, or combinations thereof, based on the desired properties of the material when employed to form the nanohole array. While material with relatively high magnetic anisotropy, Ku, may be used, methanol etching, e.g., REI with methanol, may also work for Fe, Co, and/or Ni alloys.

Figure 2A:
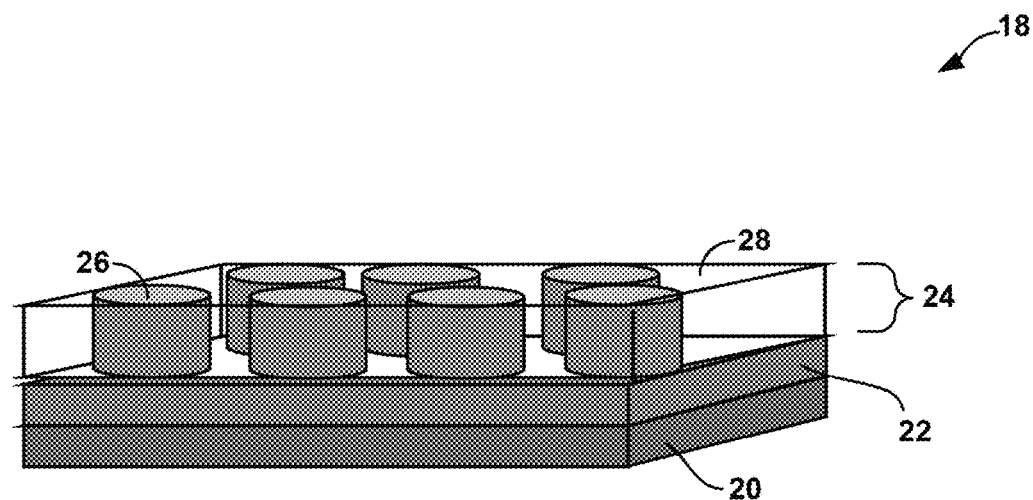
FIGS. 2a-2c are conceptual diagrams illustrating an example article at various times during the fabrication process using an embedded hard mask layer within a vacuum environment.
Figure 2B:
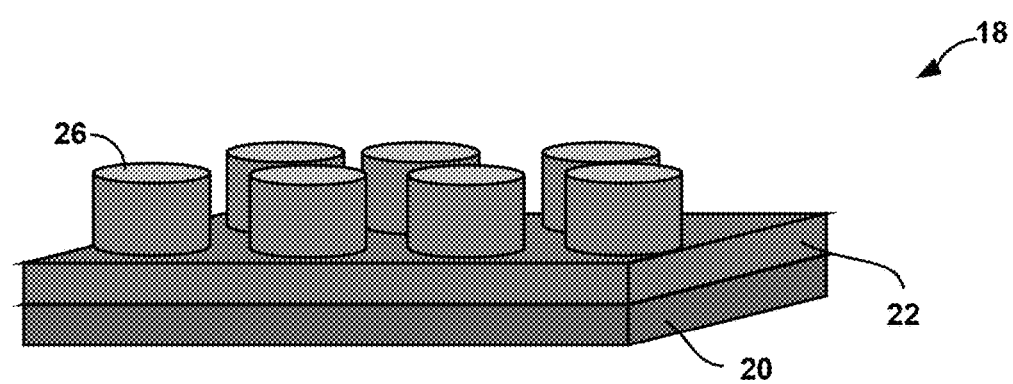
Figure 2C:
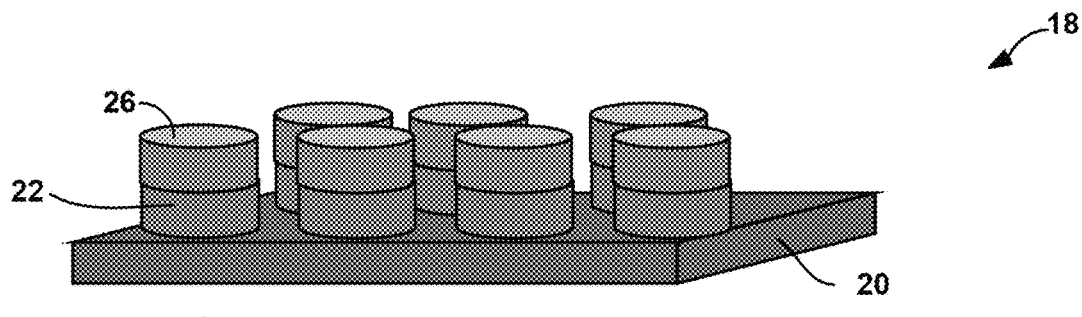

FIGS. 2a-2c are conceptual diagrams illustrating example article 18 at various times during fabrication using an embedded hard mask layer within a vacuum environment. Article 18 may undergo the fabrication described herein to form magnetic recording media, such as, e.g. heat assisted magnetic recording (HAMR) media. For ease of illustrating, the example technique of FIG. 1 will be described with reference to article 18 shown FIGS. 2a-2c. However, articles other than that of article 18 shown in FIGS. 2a-2c may be formed via the example technique of FIG. 1.

As shown in FIG. 1, a hard magnetic material may be deposited on substrate 20 to form magnetic thin film layer 22 (10). Substrate 20 may include any suitable substrate for the fabrication of the magnetic recording media. Example substrate materials include multilayer non-magnetic seed layer and under layers and soft magnetic layer on top of substrates such as amorphous and nanocrystalline glass, Al—Mg, and MgO. Although article 18 in FIGS. 2a-2c show magnetic thin film layer 22 formed directly on substrate 20, in other examples, one or more intermediate layers may first be deposited on substrate 20 such that magnetic thin film layer 22 is formed indirectly on substrate 20. Such intermediate layers may include material layers suitable for use in magnetic recording media, e.g., a seed or undercoat layer. In some examples, substrate 20 may be pre-patterned with periodical structure, e.g. narrow grooves along circumferential directly.

Magnetic layer 22 may include any hard magnetic suitable for use in magnetic recording media. In some examples, suitable materials include those materials with a relatively high anisotropy while being chemically stable under normal operating conditions for magnetic recording media. Examples of materials used to form magnetic layer 22 include FePt, FePd, CoPt, CoPd, [Co/Pd]$_n$ and [Co/Pt]$_n$ multilayer, TbFeCo, SmCo$_5$, and alloys thereof (e.g. Co alloy).

In some examples, it may be difficult to reduce the grain size of a magnetic material such as, e.g., FePt without undesirably influencing the magnetic properties of the material (e.g., reducing magnetic coercivity) and maintaining chemical ordering. In accordance with some examples of the disclosure, magnetic layer 22 may be deposited as a substantially continuous magnetic film layer rather than a granular magnetic film layer including magnetic grains and non-magnetic grain boundaries. The magnetic layer 22 may be deposited as a highly chemically ordered film under high temperature (e.g., highly L1$_0$ ordered FePt film) which exhibits a relatively large anisotropy constant and flat surface.

Following the deposition of magnetic layer 22 on substrate 20, granular layer 24 may be deposited on magnetic layer 22 (12). Granular layer 24 may include a plurality of grains 26 (only a single grain is labeled in FIGS. 2a-c for clarity) formed of a first material and grain boundary 28 formed of a second material. As shown in FIG. 1, following deposition of granular layer 24 (12), grain boundary 28 may be selectively removed while leaving plurality of grains 26 on magnetic layer 22 to form a hard mask over portions of magnetic layer 22 (14). Subsequently, the unmasked portions of magnetic layer 22 may be removed via RIE leaving only the portions of magnetic layer 22 masked by plurality of grains 26. In this manner, the pattern of plurality of grains 26, including grain size, in granular layer 24 may be transferred to magnetic layer 22. Following removal of the unmasked portion of magnetic layer 22, magnetic layer 22 may define discontinuous layer with discrete "grains" rather than a substantially continuous layer, e.g., as shown in FIG. 2c.

As described herein, the unmasked portions of magnetic layer 22 may be removed via RIE using an element with an atomic number less than Ar, such as, e.g., He and/or Ne, as a carrier gas. Using such a carrier gas for RIE of the unmasked portion may allow for the successful transfer of patterns from a hard mask to magnetic layer 22, including those patterns with features (e.g., grain sizes) less than approximately 10 nm, e.g., as a result of the reduced erosion of the hard mask during the RIE.

Any suitable material may be used to form granular layer 24. In some examples, granular layer 24 may be formed of a metal-oxide granular film, where the metal forms the grains and the oxide forms the grain boundary matrix. Granular layer 24 may be formed of materials that allow grain boundary 28 to be selectively removed (e.g., via etching) while leaving plurality of grains 26 on magnetic layer 22. Further, plurality of grains 26 may be formed of a material that allows for plurality of grains 26 to act as a hard mask that allows the unmasked portion of magnetic layer 22 to be removed RIE while leaving the masked portion of magnetic layer 22. For example, plurality of grains 26 may be removed at a relatively low rate during etching compared to the removal rate of the unmasked portions of magnetic layer 22, e.g., due to the use of an element with an atomic number less than Ar, as described herein. In some examples, granular layer 24 may be a granular Ru—SiO$_2$ layer in which plurality of grains 26 are Ru and grain boundary 28 is SiO$_2$. Other example materials for plurality of grains 26 include Re, Ta, Ti, NiAl, RuAl, FePt, and Fe. Other example materials for grain boundary 28 include Al$_2$O$_3$, Ta$_x$O$_y$, TiO$_2$, Si$_x$N$_y$, Al$_x$N$_y$, Hf$_x$O$_y$, and other oxides/nitrides.

Granular layer 24 may be selected to have a pattern (e.g. grain size, grain uniformity, grain distribution, and/or center-to-center distance between grains, grain boundary distance) that is desirable for a magnetic layer for magnetic layer 22. For example, the pattern of plurality of grains 26 may define a pattern such that magnetic layer 22 functions as magnetic recording layer for magnetic recording media with desirable properties once the unmasked portions magnetic layer 22 are removed. In some examples, the patterned magnetic layer 22 may define a grain size less than approximately 10 nm or approximately 5 nanometers (nm), such as, e.g., less than approximately 4 nm, or less than approximately 3 nm. In some examples, the patterned magnetic layer 22 may define a grain size between approximately 2 nm and approximately 20 nm. The mean center-to-center distance between the grains of patterned magnetic layer 22 may be less than approximately 10 nm or approximately 6 nanometers (nm), such as, e.g., less than approximately 5 nm. Further the patterned magnetic layer 22 may have a magnetic coercivity greater than approximately 2000 Oersted (Oe), such as, e.g., greater than approximately 5,000 Oe, greater than approximately 10,000 Oe, or greater than approximately 15,000 Oersted. In some examples, patterned magnetic layer 22 may have a dispersion of less than approximately 5%.

Magnetic layer 22 and granular layer 24 may be deposited using any suitable technique. Example deposition techniques include sputtering, thin film evaporation, chemical vapor deposition, ion beam sputtering, facing target sputtering, and laser beam ablation deposition. In some examples, during the formation of granular layer 24, an electrical field may be applied to induce the ordered structure of grains for the mask layer.

Magnetic layer 22 and granular layer 24 may be deposited to form a thin film layer with a suitable thickness. In some examples, magnetic layer 22 may have a thickness of less than approximately 20 nm, such as, e.g., between approximately 5 nm and approximately 20 nm. In some examples, granular layer 24 may have a thickness of less than approximately 10 nm such as, e.g., between approximately 1 nm and approximately 10 nm.

Grain boundary material 28 of granular layer 24 and the unmasked portions of magnetic layer 22 may be removed using any suitable technique. Example removal techniques include etching, such as, e.g., reactive ion etching, or ion beam milling process.

Although not shown in FIG. 1, in some examples, following the removal of the unmasked portions of magnetic layer 22, article 18 may undergo one or more processes to remove plurality of grains 24 from magnetic layer 22. Additionally, the magnetic layer 22 may undergo one or more annealing steps following removal of the unmasked portions (16). The annealing may be performed, e.g., to use a lamp radiation method, and other rapid thermal annealing methods, e.g. laser heating. Example annealing conditions include heat treatment at a temperature above approximately 500 degrees Celsius for a duration greater than approximately 4 second, such as, e.g., between approximately 4 seconds and approximately 1 hour.

The deposition and/or removal processes described herein may be carried out in a vacuum environment. For example, such steps may be performed within an environment in which the pressure is less than approximately 500 mTorr, such as, e.g., less than approximately 10 mTorr. By performing all or some of the deposition and/or removal processes in a vacuum environment, impurities that result from exposure to a non-vacuum environment may be reduced or substantially eliminated from article 18. Example impurities include air borne particles and water vapor.

In some examples, the example technique of FIG. 1 may be carried out entirely within a vacuum environment. That is, the deposition of magnetic layer 22 (10) and granular layer 24 (12) as well as the removal of grain boundary 28 (14) and unmasked portions of magnetic layer 22 (16) may all be performed in a vacuum environment. Further, the example technique of FIG. 1 may be carried out entirely within a vacuum environment without removing article 18 from the vacuum environment, i.e., article 18 remains in a vacuum environment from deposition of magnetic layer 22 on substrate 20 (10) until the unmasked portion of magnetic layer 22 is removed (16).

In some aspects, this disclosure relates to system and apparatus configured to perform one or more of fabrication techniques described herein. For example, FIGS. 3 and 4 are schematic diagrams illustrating example systems 28 and 38, respectively, for fabricating an article, e.g., article 18, using an embedded hard mask layer, e.g., granular layer 24, within a vacuum environment. Each to the example systems 28 and 38 may perform the fabrication technique of FIG. 1 within a vacuum environment.

As shown in FIG. 3, system 28 includes sputtering chamber 30 and reactive ion etching chamber 32. Sputtering chamber 30 may be configured to sputter deposit magnetic layer 22 on substrate 20, e.g., such as wafer 36 (10) and sputter deposit granular layer 24 on magnetic layer 22 (12) within a vacuum environment. Reactive ion etching chamber 32 may be configured to remove grain boundary 28 (14) and unmasked magnetic layer 22 (16) via reactive etching within a vacuum environment. Although not shown, system 28 may include a gas source that supplies reactive ion etching chamber 32 with a desired flow of carrier gas during the etching process. As described herein the carrier gas may include a gas with an atomic number less than an atomic number of argon, such as, e.g., He or Ne. The carrier gas may also include methanol ($CH_3OH$), carbon monoxide and ammonia ($CO+NH_3$), and/or chlorine ($Cl_2$) in some examples.

The flow and/or concentration of the carrier gas within the chamber 32 may vary based on the specific type of RIE apparatus employed, e.g., parallel plate RIE versus another type of RIE apparatus. In some examples, a gas flow rate of about 30 to about 50 standard cubic centimeters per minute (sccm) of He or Ne may be used, e.g., in combination with a flow of about 10 sccm methanol, carbon monoxide and ammonia ($CO+NH_3$), and/or chlorine ($Cl_2$). However, other flow rates are contemplated. In some examples, it may be preferred to have a larger percentage of methanol.

The source of a gas with an atomic number less than an atomic number of argon, such as, e.g., He or Ne, during the RIE is not simply air, which may contain some nominal amount of He and/or Ne.

Sputtering chamber 30 is connected to etching chamber 32 via vacuum transfer region 34. Vacuum transfer region 34 allows for a substrate, such as, e.g., wafer 36 to be transferred between the chambers while maintaining a vacuum environment. In this manner, the sputtering and etching processes may take place in system 28 without subjecting the fabricated article to a non-vacuum environment, e.g., between formation of the magnetic and granular layers.

As shown in FIG. 4, system 38 includes first sputtering chamber 40, second sputtering chamber 42, and reactive ion etching chamber 44. Each of the chamber 40, 42, and 44 are connected via vacuum transport regions 48. System 38 may be substantially similar to that of system 28 (FIG. 3). However, system 38 includes first and second sputtering chambers 40, 42 for the deposition of magnetic layer 22 and granular layer 24, respectively, rather than only one sputtering chamber as with system 28. Moreover, system 28 is configured to process discrete wafer 36 that is transferred from chamber to chamber while system 38 is configured to process continuous substrate 50 that may be transferred from chamber to chamber, e.g., using multiple rollers. System 38 may be particularly useful, e.g., when fabricating nanoparticles using a soft and flexible (e.g. polymer) substrate 50.

In this sense, although some of the example processes may be used for fabricating magnetic recording media, such as, e.g., article 18, for use in magnetic hard drives, the techniques and structures described herein may be applicable to other uses, such as fabrication of artificial nanoparticles and nanohole arrays with a low-cost process with high throughput. Other nanostructures include nanorings, nanodisks, and the like.

FIGS. 5a-5d are conceptual diagrams illustrating another example article 52 at various times during the fabrication process using an embedded hard mask layer within a vacuum environment. In particular, the fabrication process may be used to form a plurality of nanoparticles. In the example of FIG. 5a-5d, nanoparticles 70 with a Fe(Co)/Au/Fe(Co) multilayer structure are formed, e.g., for biosensing, although other compositions and applications are contemplated.

Figure 5A:
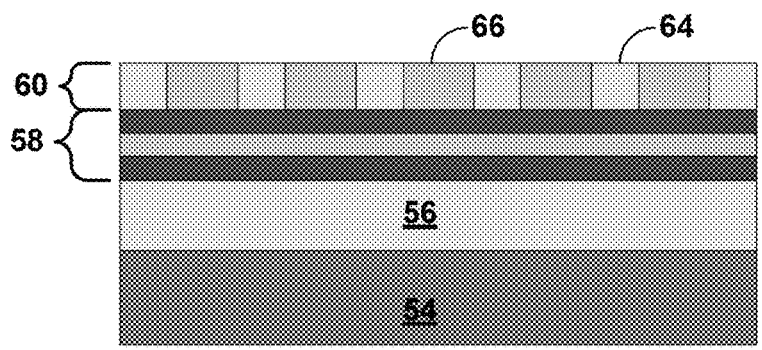
FIGS. 5a-5d are conceptual diagrams illustrating another example article at various times during the fabrication process using an embedded hard mask layer within a vacuum environment.

In FIG. 5a, article 52 includes $SiO_2$ layer 56 deposited on Si wafer 54. Magnetic stack 58 with a Fe(Co)/Au/Fe(Co) structure is formed on $SiO_2$ layer 56. Magnetic stack may have a continuous layer structure rather than granular layer structure. Granular layer 60 is formed on magnetic stack 58. Granular layer 60 may be substantially the same or similar to that of granular layer 24 (FIGS. 2a-2c). As shown, granular layer 60 includes plurality of grains 66 formed of a first material and grain boundary 64 formed of a second material. In some examples, granular layer 60 may be a Au—$SiO_2$ layer with grains 66 formed of Au and grain boundary formed of $SiO_2$. Each of the layers of article 52 may be deposited using any suitable technique (e.g., sputtering).

Figure 5B:
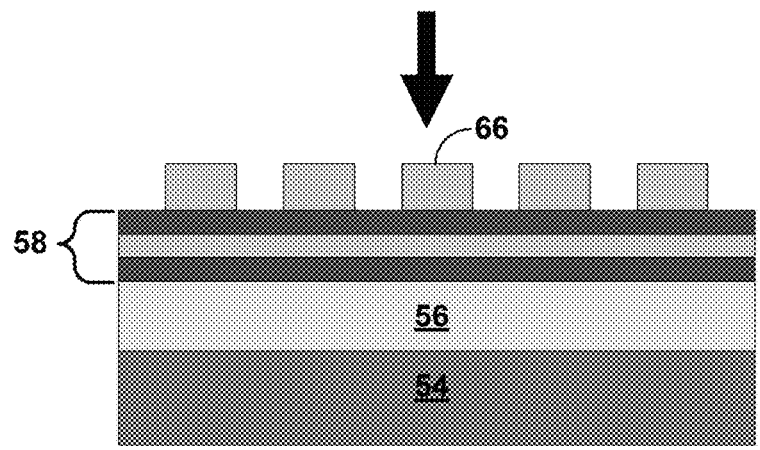
Figure 5C:
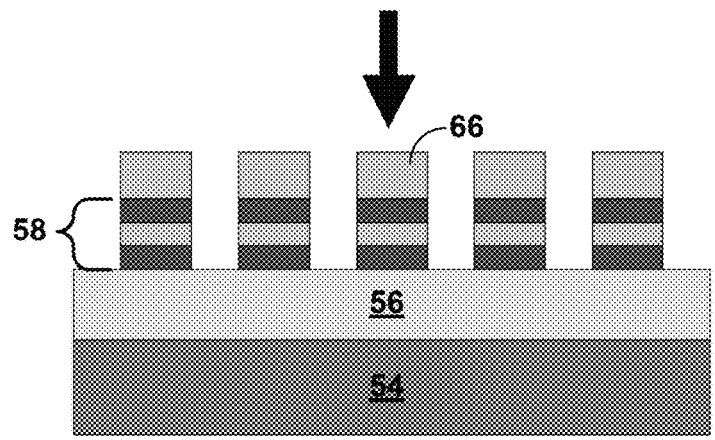
Figure 5D:
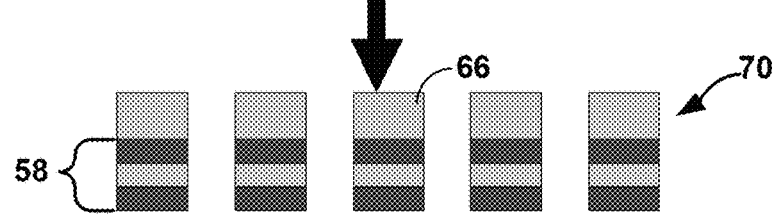

As shown in FIG. 5b, after granular layer 60 is formed, grain boundary 64 may be selectively removed, e.g., via etching such as reactive ion etching, while leaving plurality of grains 66 on magnetic stack 58 to form a hard mask over portions of magnetic stack 58. Subsequently, shown in FIG. 5c, the unmasked portions of magnetic stack 58 may be removed via reactive ion etching, according to one or more of the examples described herein, leaving only the portions of magnetic stack 58 masked by plurality of grains 66 to form a magnetic dot array. In this manner, the pattern of plurality of grains 66 in granular layer 60 may be transferred to magnetic stack 58. Each of the "dots" defined by the remaining portions of magnetic stack 58 and grains 66 may be lifted from $SiO_2$ layer 56 and Si wafer 54 to form a plurality of nanoparticles (including nanoparticle 70) with a Fe(Co)/Au/Fe(Co)/Au stack structure. In some examples, nanoparticle 70 may have a grain size between approximately 2 nm to 100 nm.

More complicated stacks with multifunctions, e.g. Au/Fe/Ag/Fe/Au/Fe/Ag, with good and integrated magnetic and plasmonic performances may be patterned into nanoparticles or nanorings or nanoholes. In some examples, magnetic and plasmonic integrated nanostructures could be fabricated, e.g. Au/Ni/Au/Ni/Au, Au/Ag/Fe(Co)/Ag/Au, Au/Ag/$Fe_4$N/Ag/$Fe_4$N/Ag/Au, for magnetic sensing, drug delivery and hyperthermia, for example. As another example, more complicated stacks with bar code behavior, e.g., Au/Fe(t1)/Au/Fe(t2)/Au/Fe(t3)/Au/Fe(t4)/Au (where t1, t2, t3 and t4 refer to different thickness for Fe layer), could be patterned into nanostructure for different labeling and sensing purpose.

Similar to that of the process of FIG. 1, one or more of the fabrication steps of the process described with regard to FIGS. 5a-5d may be carried out within a vacuum environment. In some examples, each of the steps may be carried out entirely within a vacuum environment. In some examples, all of the steps may be carried out entirely within a vacuum environment without removing article 52 from the vacuum environment.

Other nanoparticle structures may be achieved using the technique illustrated with regard to FIGS. 5a-5d, e.g., based on the compositions of magnetic stack 58 and granular layer 60. For example, biocompatible $Fe_3Si$ and $Fe_5Si_3$ smart nanoparticles may be fabricated. As another example, Au/Fe (Co)/Ru/Fe(Co)/Au with different Ru layer thickness as magnetically and antiferromagnetically tunable nanoparticles may be fabricated. Other examples are contemplated.

FIGS. 6a-6d are conceptual diagrams illustrating another example article 72 at various times during the fabrication process using an embedded hard mask layer within a vacuum environment. In particular, the fabrication process may be used to form a nanohole array, e.g., for use in optical transmission or surface plasma resonance biosensing. In FIGS. 6a-6d, the nanohole array is defined in a Au layer. However, other suitable materials may be used other than that of Au.

Figure 6A:
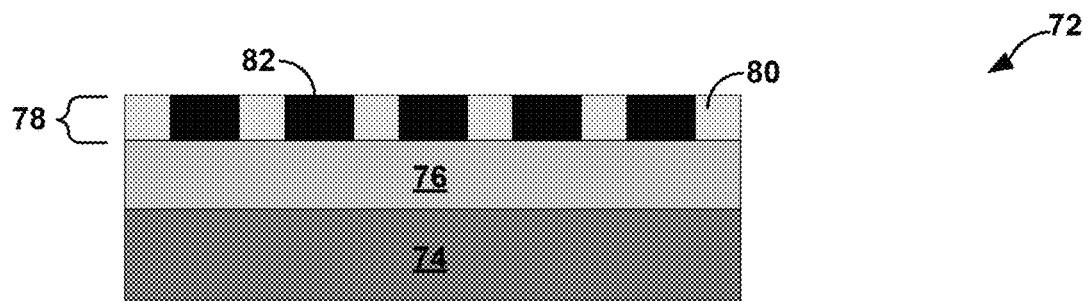
FIGS. 6a-6d are conceptual diagrams illustrating another example article at various times during the fabrication process using an embedded hard mask layer within a vacuum environment.

In FIG. 6a, article 72 includes Au thin film layer 76 deposited on substrate 74. Au layer 76 may be deposited as a substantially continuous film layer. In some examples, Au layer 70 may have a thickness between approximately 2 nm to 100 nm. Layer 70 may be formed of Au for surface plasmonic effect and it being substantially inert. Other suitable materials for layer 70 include Ag, ZrN, $Fe_4$N, Ni, or combinations thereof. Layer 70 may include additives such as, e.g., Ag, Ti, N, Ni, Pd, Pt, Re, and/or Ru.

Granular layer 78 is formed on Au layer 76. Granular layer 78 may be substantially the same or similar to that of granular layer 24 (FIGS. 2a-2c) and granular layer 60 (FIGS. 5a-5d). As shown, granular layer 78 includes plurality of grains 80 formed of a first material and grain boundary 82 formed of a second material. In some examples, granular layer 60 may be a Pt—$SiO_2$ layer with grains 66 formed of $SiO_2$ and grain boundary formed of Pt. In other examples, granular layer 60 may be a Fe—$SiO_2$ layer. Each of the layers of article 52 may be deposited using any suitable technique (e.g., sputtering).

Figure 6B:
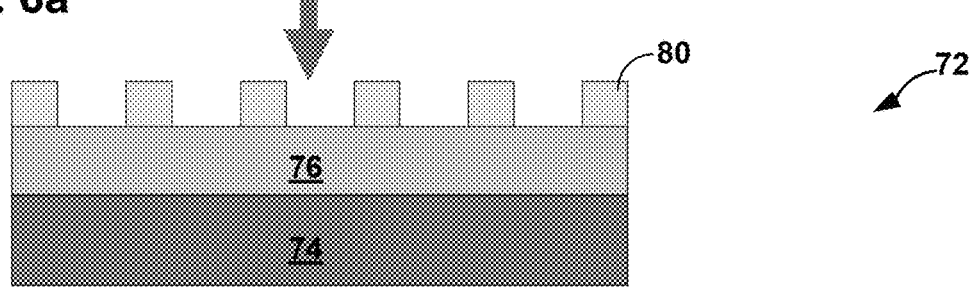
Figure 6C:
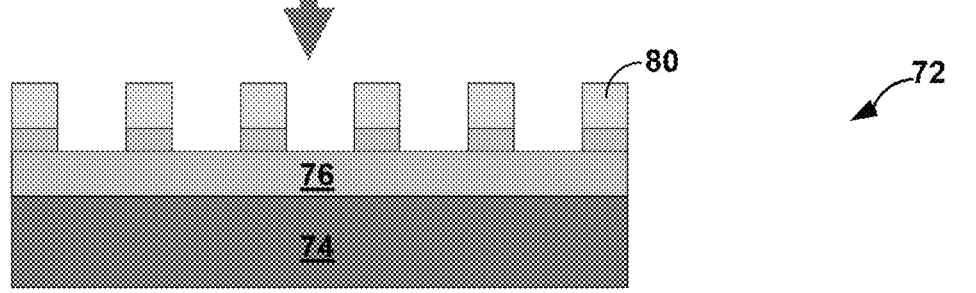
Figure 6D:
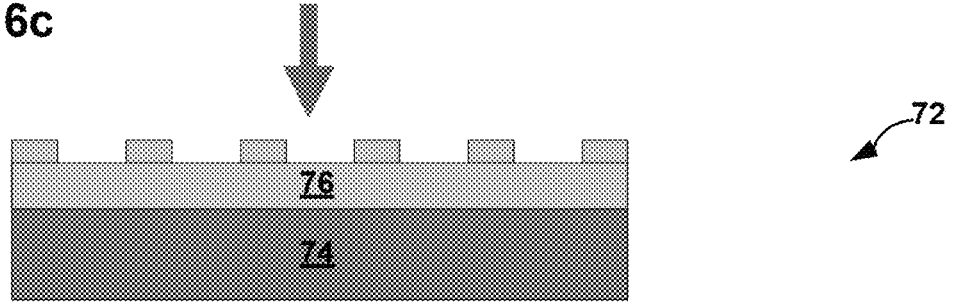

As shown in FIG. 6b, after granular layer 78 is formed, grain boundary 82 may be selectively removed, e.g., via methanol etching, while leaving plurality of grains 80 on Au layer 76 to form a hard mask over portions of Au layer 76. Subsequently, shown in FIG. 6c, the unmasked portions of Au layer 76 may be removed via reactive ion etching, according to one or more of the example techniques described herein. However, unlike previously described, only a portion of the unmasked portion of Au layer 76 is removed rather than removing the unmasked portions all the way down to the underlying layer. In this manner, the masked portions of Au layer 76 have a thickness greater than that of the unmasked portions of Au layer 76 as defined by the $SiO_2$ mask. Grains 80 may be removed from Au layer 76, as shown in FIG. 6d, such that Au layer 76 defines a nanohole array. In some examples, the nanoholes in the resulting nanohole array may have a grain size between approximately 2 nm to 100 nm, or less than 10 nm. In some examples, grains 80 are not removed using ion milling. In some examples, the entire process for forming article 72 or other example articles described herein may be advantageously carried out without using ion milling.

Similar to that of the process of FIG. 1, one or more of the fabrication steps of the process described with regard to FIGS. 6a-6d may be carried out within a vacuum environment. In some examples, each of the steps may be carried out entirely within a vacuum environment. In some examples, all of the steps may be carried out entirely within a vacuum environment without removing article 72 from the vacuum environment.

EXAMPLES

Various experiments and simulations were carried out to evaluate one or more aspects of example of the disclosure. However, the disclosure is not limited by the described experiments and simulations.

Figure 7B:
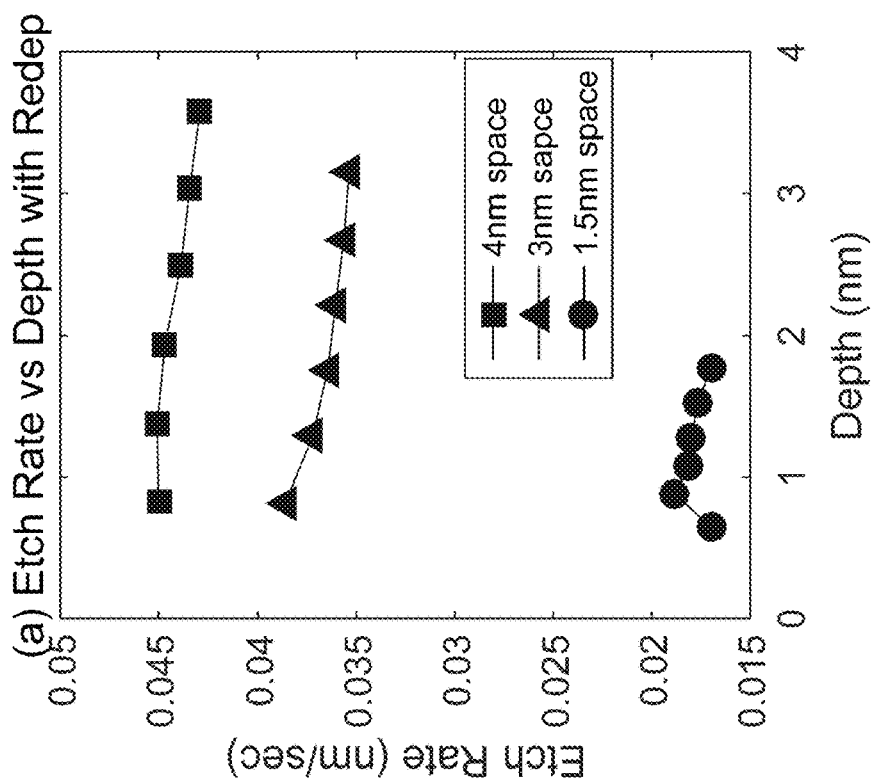
FIGS. 7A-7B are plots modeling aspects of an examples RIE process.
Figure 7A:
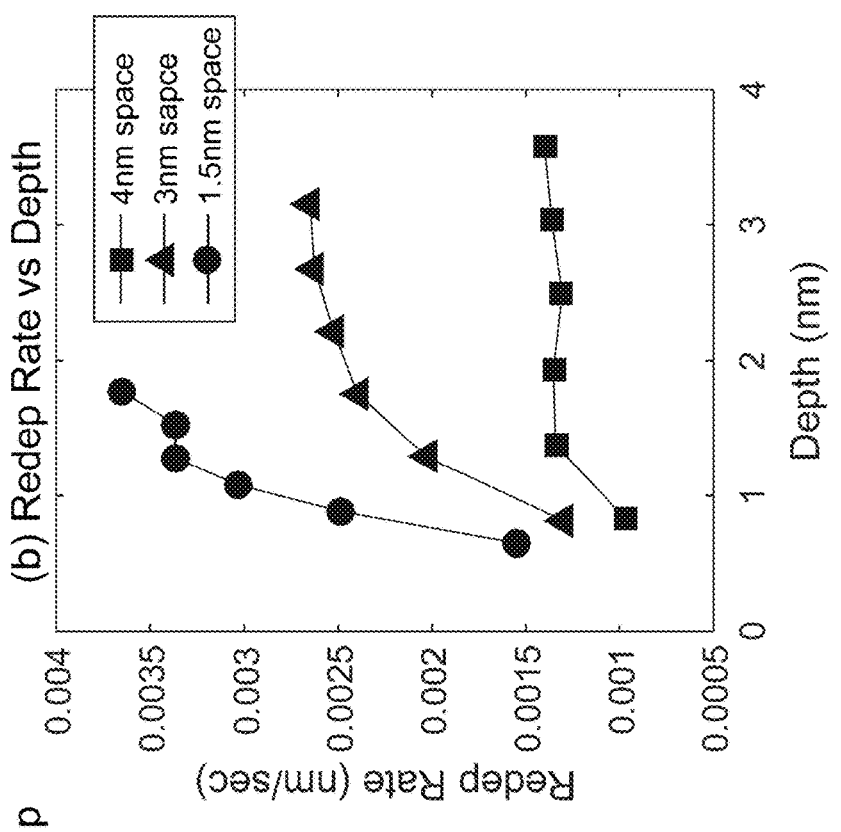

FIGS. 7A and 7B are plots modeling RIE of an FePt (8 nm)/Ru(2 nm) sample film assuming an FePt sputter yield of about 0.1. FIG. 7A is a plot of etch rate versus depth with re-deposition and FIG. 7B is a plot of re-deposition versus depth for various desired features sizes (4 nm space, 3 nm space, and 1.5 nm space). The plots show that as the feature size one attempts to etch shrinks with respect to the pattern (increased aspect ratio), the etch rate dramatically decreases due to re-deposition of the film being etched on the side walls. One of the reasons the He (or other gas with an atomic number less than an atomic number of argon) RIE may be superior to the Ar is that there is less re-deposition, so the limit on etch rate should be less.

Figure 8:
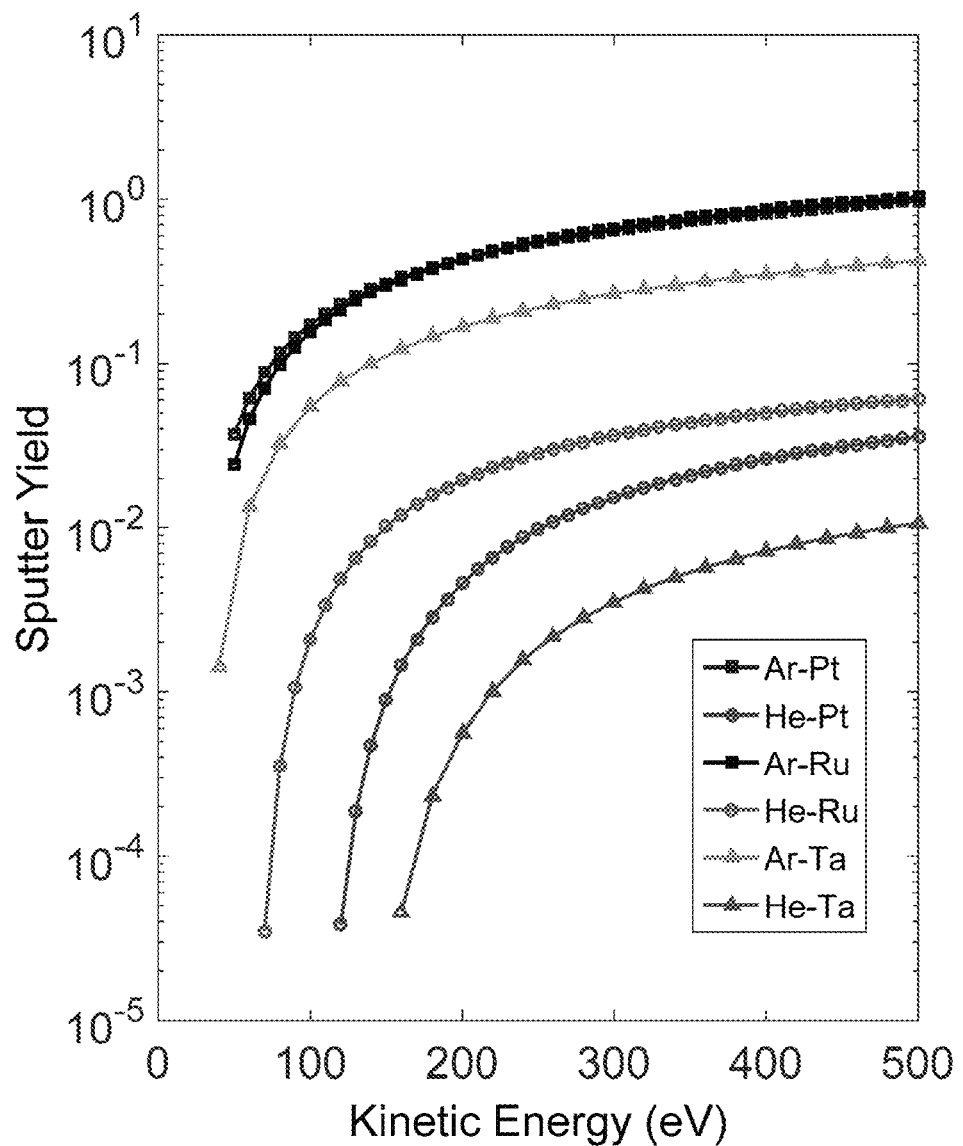
FIG. 8 is a plot modeling sputter yield versus kinetic energy for various example etch gas ions and hard mask material pairing.

FIG. 8 is a plot of simulated physical sputter yield of etch gas ions and hard-mask material pairing. It is shown that Helium (atomic weight 4) gas can help reduce mask erosion. For example, if Helium gas pairs with materials like Ta hard-mask, mask erosion can be reduced about two orders of magnitude in the low energy range (<300 eV) than Ar (atomic weight 39.95).

Figure 9:
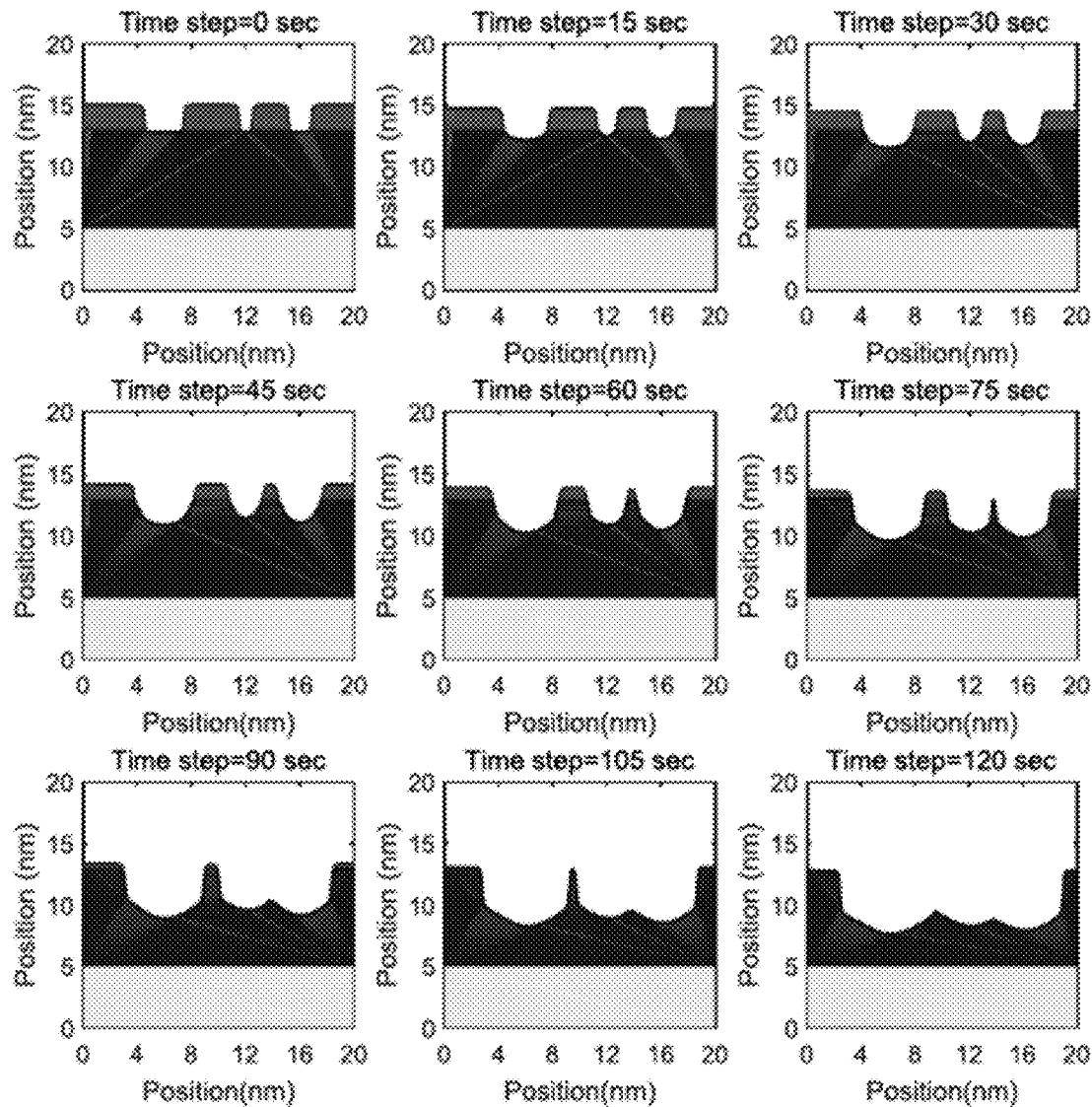
FIG. 9 is a series of plots modeling the time evolution of etched grain and grain spacing under Ar etch with ion energy at 250 eV condition.

FIG. 9 is a series of plots modeling the time evolution of etched grain and grain spacing under Ar etch with ion energy at 250 eV condition. Top layer is Ru hard mask, mid-layer is FePt and bottom layer is Cr etch stop. Sputter yield was assumed 0.6 for both Ru hard mask and FePt. Chemical etch selectivity 50:1 in open space.

Figure 10:
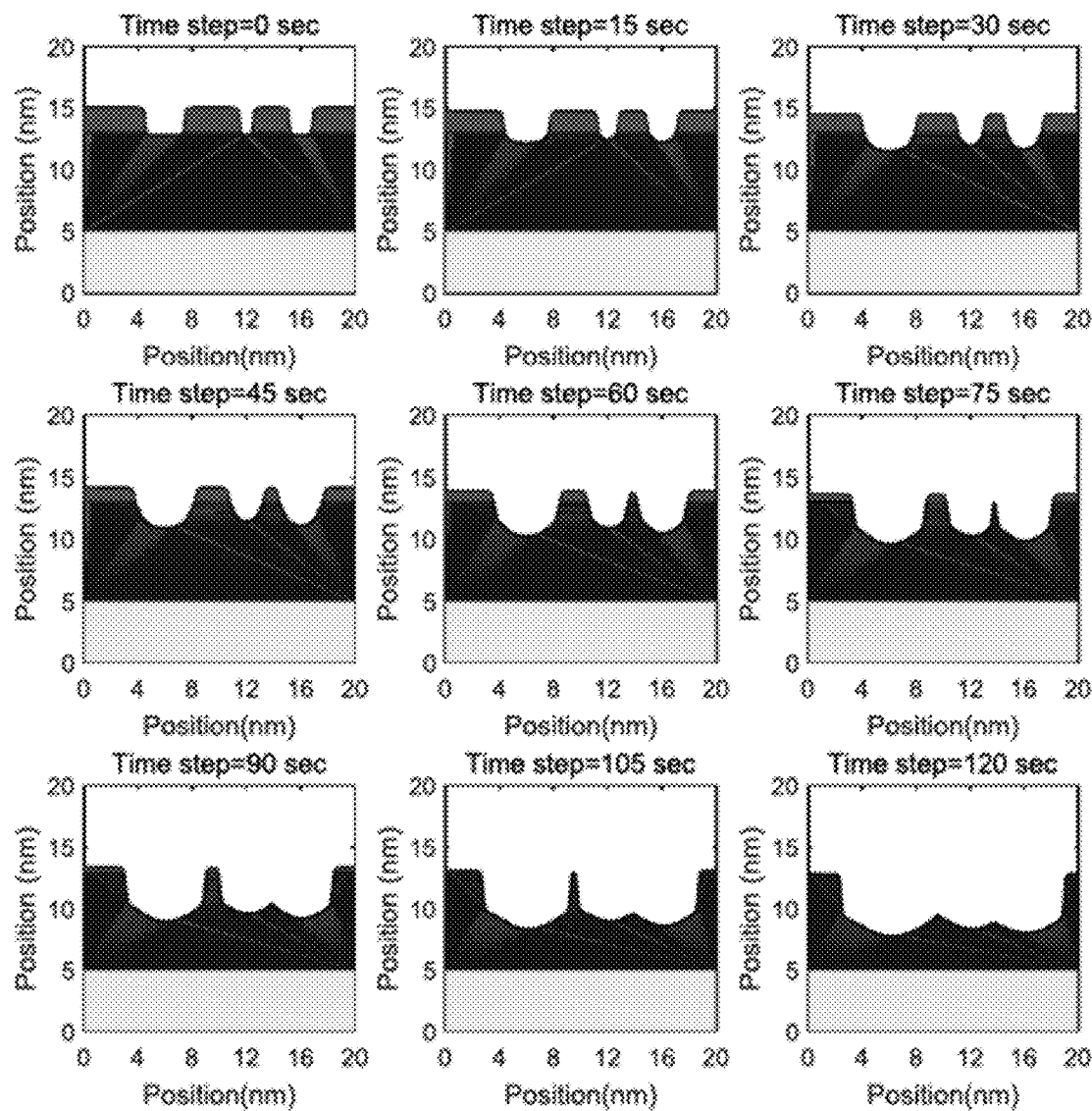
FIG. 10 is a series of plots modeling time evolution of etched grains and grain spacing under He etch with ion energy at 250 eV condition.

FIG. 10 is a series of plots modeling time evolution of etched grains and grain spacing under He ion energy at 250 eV condition. Sputter yield was assumed 0.01 for Ru hard mask and 0.03 FePt. Chemical etch selectivity of FePt to Ru hard mask is assumed high at 50:1. It is shown although all grains have shown lateral size reduction. Different from Ar gas case in FIG. 9, the hard mask on top of these gains were only partially consumed leading to well isolated (large) grains.

Figure 11A:
FIGS. 11A-11C, 12A-12C, and 13A-13D are scanning electron microscope (SEM) images relating to an experiment performed to evaluate one or more aspects of the disclosure.
Figure 11B:
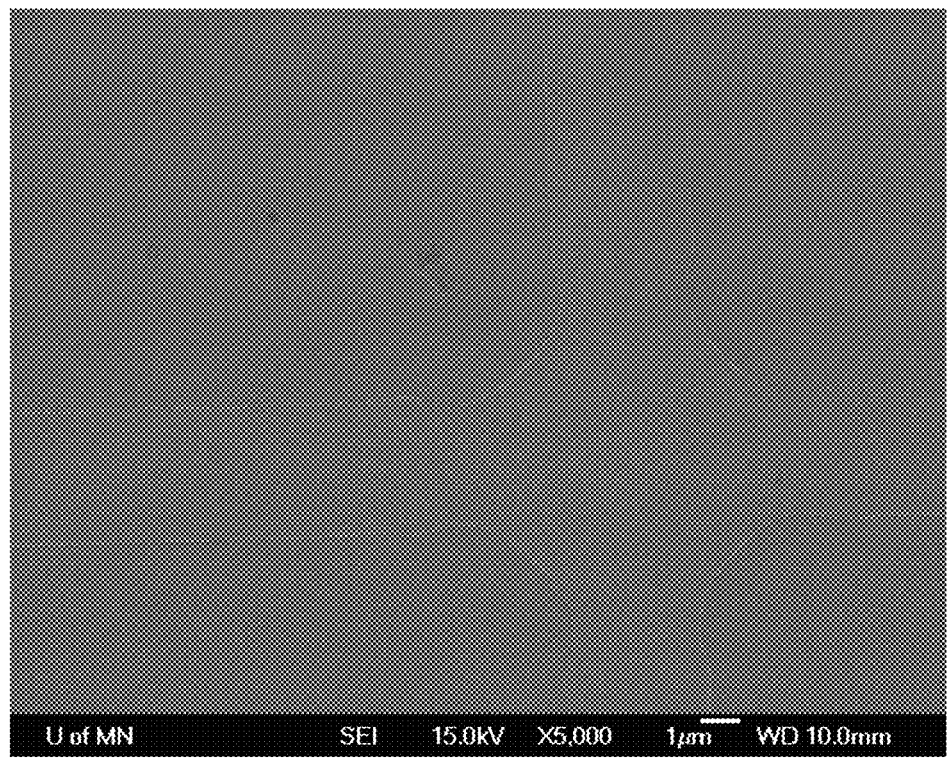
Figure 11C:
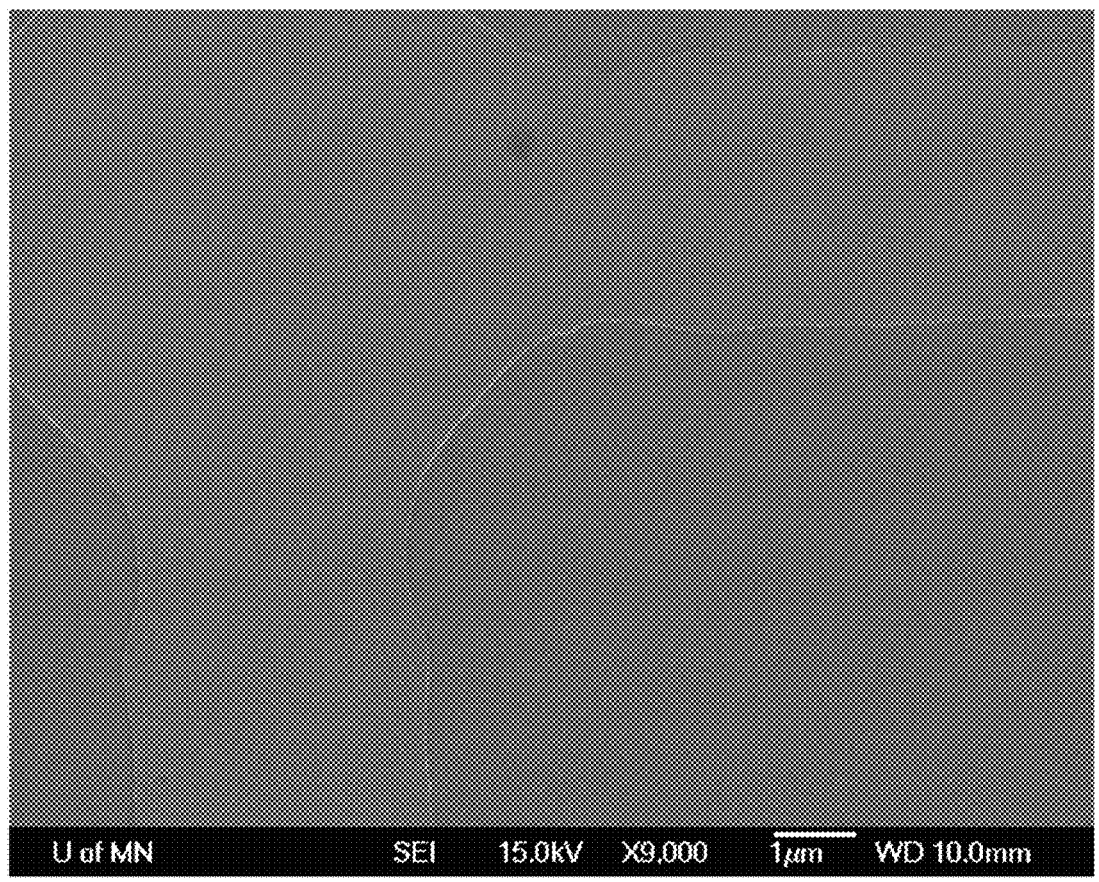

An experiment was performed to compare the use of Ar-based RIE versus He-based RIE. The film used in each case has a film structure of MgO/Cr(13)/FePt(15)/Pt(3) (thickness in nm) with 10 nm thick patterned lines and bars of Ta prior to etching. FIG. 11A-11C are scanning electron microscope (SEM) images of the as deposited film prior to etching. FIG. 11A is a SEM image of top down on cross bars. The large spots in the image are dust. FIGS. 11B and 11C are images on the profile of corner of Ta bars. As shown, the bars were not damaged and the lower FePt/Pt film were "clean."

Figure 12A:
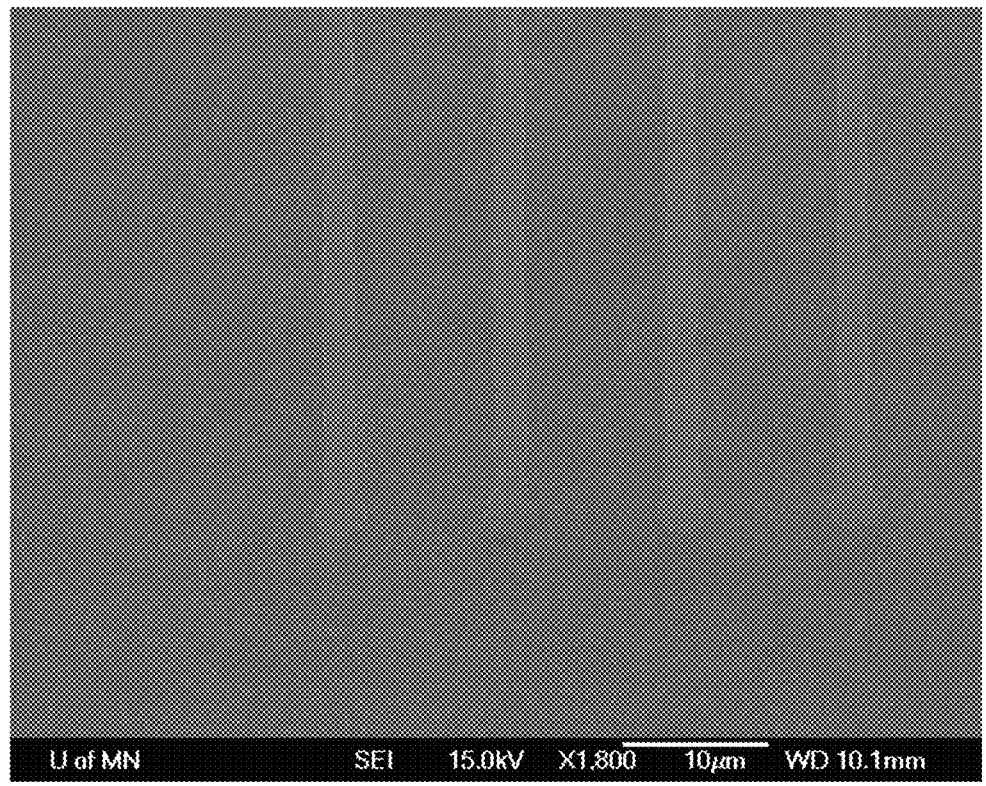
Figure 12B:
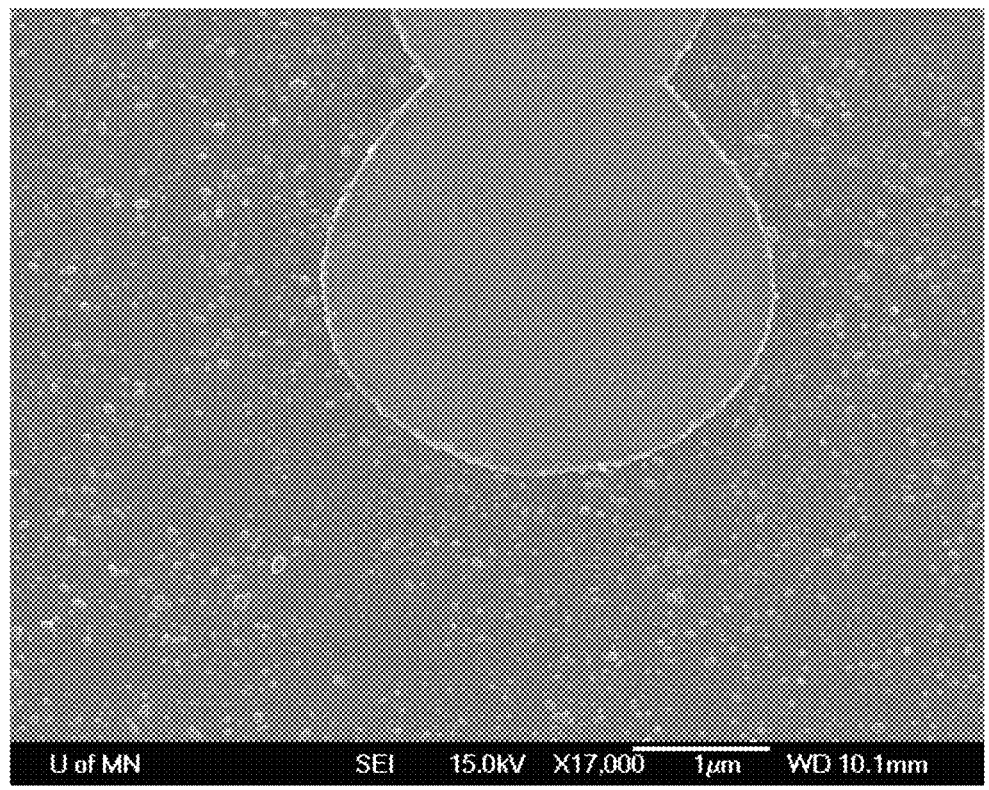
Figure 12C:
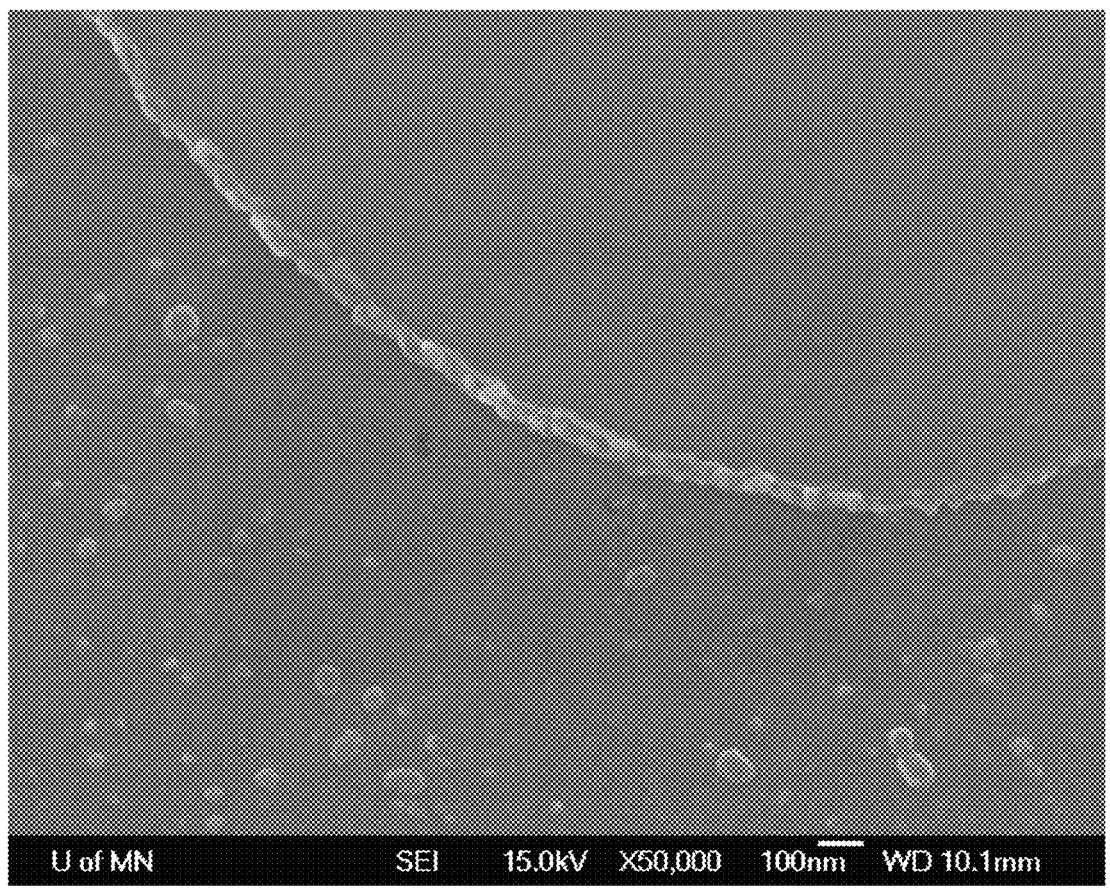
Figure 13A:
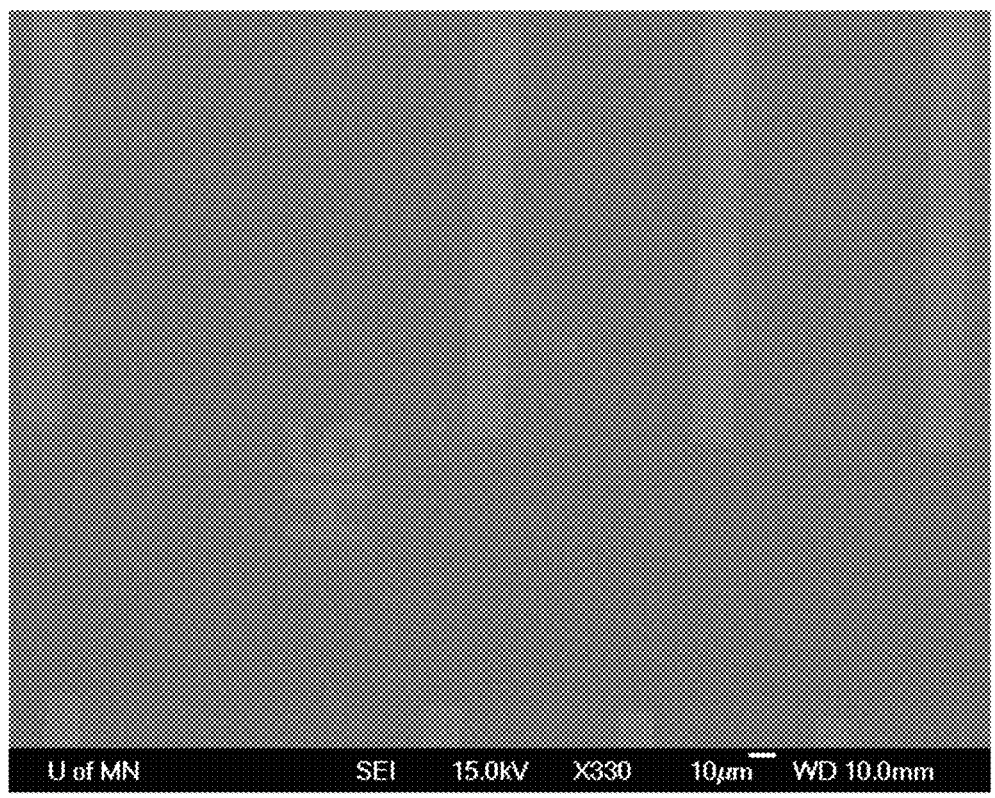
Figure 13B:
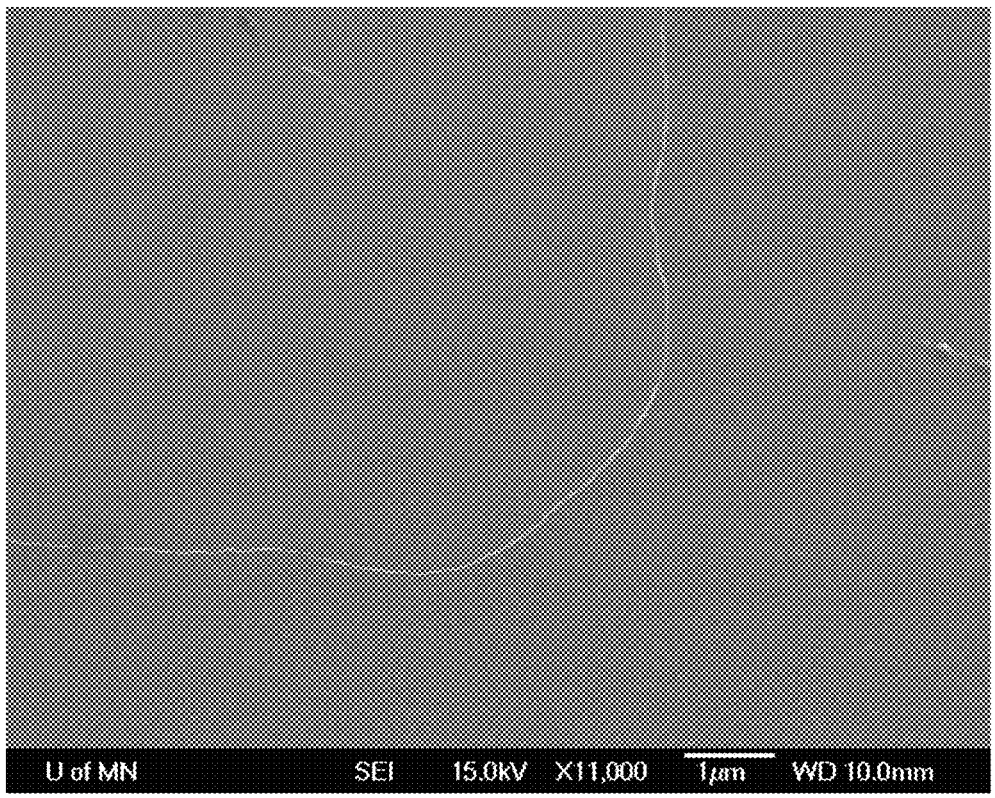
Figure 13C:
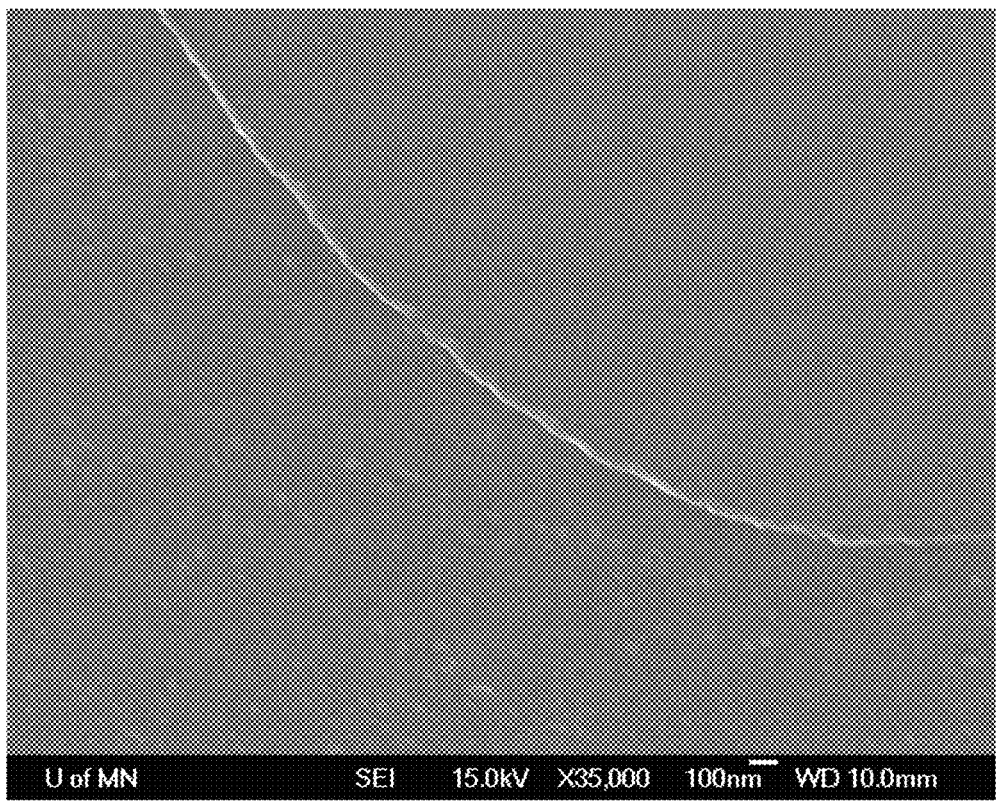
Figure 13D:
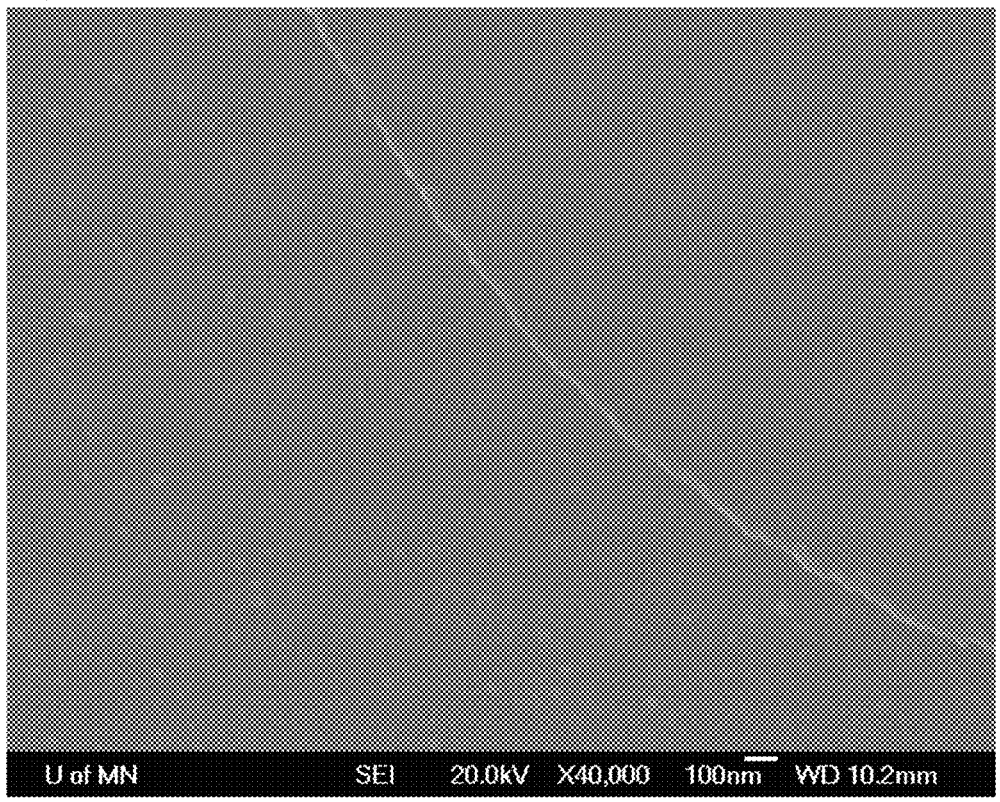

The film with the film structure of MgO/Cr(13)/FePt(15)/Pt(3) (thickness in nm) with 10 nm thick patterned lines and bars of Ta was etched for 3 minutes using Ar plus methanol RIE. A gas flow of 50 sccm Ar plus 10 sccm methanol was used during the etching. FIGS. 12A-C are SEM images of the with the images progressively zoomed in on pillar from 12A to 12C. Based on the images, it was clear the underlying film has been etched by the profile of the Ta pillar, and there was significant mask erosion and re-deposition based on the many particles.

As a comparison, the film with the film structure of MgO/Cr(13)/FePt(15)/Pt(3) (thickness in nm) with 10 nm thick patterned lines and bars of Ta was etched for 3 minutes using He plus methanol RIE. A gas flow of 50 sccm He plus 10 sccm methanol was used during the etching. FIGS. 13A-D are SEM images of the with the images progressively zoomed in on pillar from 13A to 13D. Based on the images, it was clear the underlying film had been etched by the profile of the Ta pillar.

The experiment performed to compare Ar plus methanol RIE versus He plus methanol RIE illustrated at least two items. First, etching does occur in both cases, showing He based plasma is feasible. Second, in He plus methanol RIE, the etch rate was slower, and there appeared to be less damage to the mask and less re-deposition.

Various aspects of the disclosure have been described. These and other aspects are within the scope of the following claims.

The invention claimed is:

1. A method comprising:
depositing a functional layer over a substrate;
depositing a granular layer over the functional layer, the granular layer including a first material defining a plurality of crystalline grains separated by a second material defining grain boundaries of the plurality of crystalline grains;
removing the second material from the granular layer such that the plurality of crystalline grains of the granular layer define a hard mask layer on the functional layer; and
removing, via reactive ion etching with a carrier gas, portions of the functional layer not masked by the hard mask layer, wherein the carrier gas comprises a gas with an atomic number less than an atomic number of argon.

2. The method of claim 1, wherein the carrier gas comprises at least one of a helium or neon.

3. The method of claim 2, wherein the carrier gas includes at least one of methanol ($CH_3OH$), carbon monoxide and ammonia ($CO+NH_3$), or chlorine ($Cl_2$).

4. The method of claim 1, wherein removing, via reactive ion etching with the carrier gas, portions of the functional layer not masked by the hard mask layer comprises etching the portions of the functional layer not masked by the hard mask layer and reducing an erosion rate of the hard mask layer compared to that of using carrier gas including Ar.

5. The method of claim 1, wherein removing portions of the functional layer not masked by the hard mask layer comprises removing portions of the functional layer not masked by the hard mask layer to define a patterned magnetic layer including the unremoved portions of the functional layer and the hard mask.

6. The method of claim 5, wherein a grain size of the patterned magnetic layer is less than approximately 10 nanometers.

7. The method of claim 6, wherein the coercivity of the patterned magnetic layer is greater than approximately 2000 Oersted.

8. The method of claim 7, wherein the patterned magnetic layer includes at least one of FePt, Co with a hexagonal close packet (hcp) structure, or a material with a body centered tetragonal (bct) structure.

9. The method of claim 5, further comprising removing the patterned magnetic layer from the substrate, wherein respective portions of the removed patterned magnetic layer define at least one of nanoparticles, nanorings or different freestanding nanostructures.

10. The method of claim 1, wherein the functional layer comprises a plurality of functional layers defining nanostructures that function as magnetic, plasmonic and/or optical or integrated bar code or different coloring.

11. The method of claim 1, wherein the granular layer includes at least one of Ta—Ta$_x$O$_y$, Ta—SiO$_2$, TiN—SiO$_2$, RuAl—Al$_2$O$_3$, or Hf—Si$_2$O$_3$.

12. The method of claim 1, wherein the functional layer comprises a magnetic layer.

13. The method of claim 1, wherein the carrier gas consists essentially of at least one of a helium or neon.

14. The method of claim 1, wherein the carrier gas consists essentially of at least one of a helium or neon and at least one of methanol (CH$_3$OH), carbon monoxide and ammonia (CO+NH$_3$), or chlorine (Cl$_2$).

* * * * *